(12) United States Patent
Jung et al.

(10) Patent No.: US 11,348,942 B2
(45) Date of Patent: *May 31, 2022

(54) THREE-DIMENSIONAL SEMICONDUCTOR MEMORY DEVICES

(71) Applicant: Samsung Electronics Co., Ltd., Suwon-si (KR)

(72) Inventors: Euntaek Jung, Seongnam-si (KR); JoongShik Shin, Yongin-si (KR); JiHye Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 62 days.

This patent is subject to a terminal disclaimer.

(21) Appl. No.: 16/999,511

(22) Filed: Aug. 21, 2020

(65) Prior Publication Data

US 2020/0388634 A1    Dec. 10, 2020

Related U.S. Application Data

(63) Continuation of application No. 16/192,859, filed on Nov. 16, 2018, now Pat. No. 10,777,572.

(30) Foreign Application Priority Data

Apr. 30, 2018    (KR) .................... 10-2018-0050096

(51) Int. Cl.
*H01L 27/11582*    (2017.01)
*H01L 27/11524*    (2017.01)
(Continued)

(52) U.S. Cl.
CPC .. *H01L 27/11582* (2013.01); *H01L 21/28525* (2013.01); *H01L 21/76868* (2013.01);
(Continued)

(58) Field of Classification Search
CPC ......... H01L 27/11582; H01L 21/28525; H01L 21/76868; H01L 23/528; H01L 23/53271; H01L 27/11524; H01L 27/11529; H01L 27/11556; H01L 27/1157; H01L 27/11573; H01L 29/40114; H01L 29/40117;
(Continued)

(56) References Cited

U.S. PATENT DOCUMENTS 9,012,974 B2    4/2015 Chae et al.
9,508,730 B2    11/2016 Lee et al.
(Continued)

*Primary Examiner* — Patricia D Valenzuela
(74) *Attorney, Agent, or Firm* — Muir Patent Law, PLLC

(57) ABSTRACT

A three-dimensional (3D) semiconductor memory device includes a source structure disposed on a horizontal semiconductor layer and including a first source conductive pattern and a second source conductive pattern which are sequentially stacked on the horizontal semiconductor layer, an electrode structure including a plurality of electrodes vertically stacked on the source structure, and a vertical semiconductor pattern penetrating the electrode structure and the source structure, wherein a portion of a sidewall of the vertical semiconductor pattern is in contact with the source structure. The first source conductive pattern includes a discontinuous interface at a level between a top surface of the horizontal semiconductor layer and a bottom surface of the second source conductive pattern.

20 Claims, 38 Drawing Sheets

(51) Int. Cl.

| | |
|---|---|
| *H01L 27/11556* | (2017.01) |
| *H01L 27/11529* | (2017.01) |
| *H01L 21/768* | (2006.01) |
| *H01L 27/11573* | (2017.01) |
| *H01L 23/528* | (2006.01) |
| *H01L 23/532* | (2006.01) |
| *H01L 21/285* | (2006.01) |
| *H01L 27/1157* | (2017.01) |
| *H01L 21/28* | (2006.01) |
| *H01L 27/11548* | (2017.01) |
| *H01L 23/522* | (2006.01) |
| *H01L 27/11575* | (2017.01) |
| *H01L 27/115* | (2017.01) |

(52) U.S. Cl.
CPC ...... *H01L 23/528* (2013.01); *H01L 23/53271* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 29/40114* (2019.08); *H01L 29/40117* (2019.08); *H01L 23/5226* (2013.01); *H01L 23/5283* (2013.01); *H01L 27/115* (2013.01); *H01L 27/11548* (2013.01); *H01L 27/11575* (2013.01)

(58) Field of Classification Search
CPC ........... H01L 23/5283; H01L 27/11548; H01L 27/115; H01L 23/5226
See application file for complete search history.

(56) References Cited

U.S. PATENT DOCUMENTS

| | | |
|---|---|---|
| 9,530,781 B2 | 12/2016 | Miyamoto et al. |
| 9,583,439 B1 | 2/2017 | Chen |
| 9,627,405 B1 | 4/2017 | Lee |
| 9,685,452 B2 | 6/2017 | Lee et al. |
| 9,711,532 B2 | 7/2017 | Miyamoto et al. |
| 9,716,099 B2 | 7/2017 | Choi |
| 9,799,670 B2 | 10/2017 | Nishikawa et al. |
| 9,831,266 B2 | 11/2017 | Kai et al. |
| 10,777,572 B2 * | 9/2020 | Jung ................... H01L 27/1157 |
| 2006/0054976 A1 | 3/2006 | Verhoeven |
| 2011/0241101 A1 | 10/2011 | Ino et al. |
| 2014/0225652 A1 | 8/2014 | Wang et al. |
| 2016/0343730 A1 | 11/2016 | Son et al. |
| 2017/0148811 A1 | 5/2017 | Zhang et al. |
| 2017/0207226 A1 * | 7/2017 | Lee ................... H01L 27/11573 |
| 2017/0373089 A1 | 12/2017 | Kim et al. |
| 2018/0315769 A1 | 11/2018 | Huo et al. |

* cited by examiner

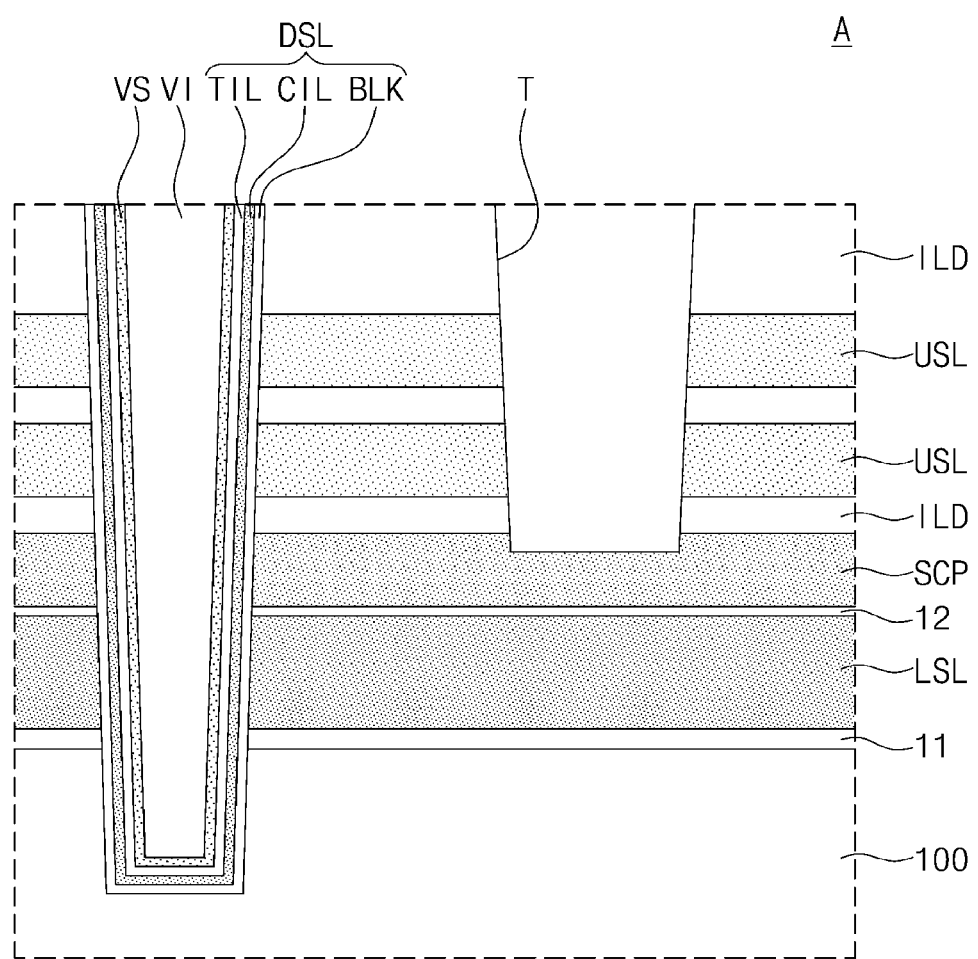

THREE-DIMENSIONAL SEMICONDUCTOR MEMORY DEVICES

CROSS-REFERENCE TO RELATED APPLICATIONS

The present application is a continuation of U.S. patent application Ser. No. 16/192,859, filed Nov. 16, 2018, which claims the benefit of Korean Patent Application No. 10-2018-0050096, filed on Apr. 30, 2018, in the Korean Intellectual Property Office, the disclosure of which is hereby incorporated by reference in its entirety.

BACKGROUND

Embodiments of the inventive concepts relate to three-dimensional (3D) semiconductor memory devices and, more particularly, to 3D semiconductor memory devices with improved reliability and integration density.

Semiconductor devices have been highly integrated to provide excellent performance and low manufacture costs. The integration density of semiconductor devices directly affects the costs of the semiconductor devices, thereby resulting in a demand of highly integrated semiconductor devices. The integration density of two-dimensional (2D) or planar semiconductor devices may be mainly determined by an area where a unit memory cell occupies. Therefore, the integration density of the 2D or planar semiconductor devices may be greatly affected by a technique of forming fine patterns. However, since relatively high-priced apparatuses are needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide three-dimensional (3D) semiconductor memory devices capable of improving reliability and integration density.

In an aspect, a 3D semiconductor memory device may include a source structure on a horizontal semiconductor layer, the source structure including a first source conductive pattern and a second source conductive pattern which are sequentially stacked on the horizontal semiconductor layer, an electrode structure including a plurality of electrodes vertically stacked on the source structure, and a vertical semiconductor pattern penetrating the electrode structure and the source structure, wherein a portion of a sidewall of the vertical semiconductor pattern is in contact with the source structure. The first source conductive pattern may include a discontinuous interface at a level between a top surface of the horizontal semiconductor layer and a bottom surface of the second source conductive pattern.

In an aspect, a 3D semiconductor memory device may include a source structure on a horizontal semiconductor layer, the source structure including a first source conductive pattern and a second source conductive pattern which are sequentially stacked on the horizontal semiconductor layer, an electrode structure including a plurality of electrodes stacked on the source structure, and a vertical semiconductor pattern penetrating the electrode structure and the source structure in a direction perpendicular to a top surface of the horizontal semiconductor layer, wherein a portion of a sidewall of the vertical semiconductor pattern is in contact with the source structure. The first source conductive pattern may include a lower portion adjacent to a top surface of the horizontal semiconductor layer, and an upper portion adjacent to a bottom surface of the second source conductive pattern. The upper portion and the lower portion may have different crystal structures from each other.

BRIEF DESCRIPTION OF THE DRAWINGS

The inventive concepts will become more apparent in view of the attached drawings and accompanying detailed description.

FIGS. 13A to 21A are cross-sectional views illustrating a method of forming a source structure of a 3D semiconductor memory device according to some embodiments of the inventive concepts.

FIGS. 13B to 21B are enlarged views of portions 'A' of FIGS. 13A to 21A, respectively.

DETAILED DESCRIPTION

Embodiments of the inventive concepts will be described hereinafter in detail with reference to the accompanying drawings.

Figure 1:
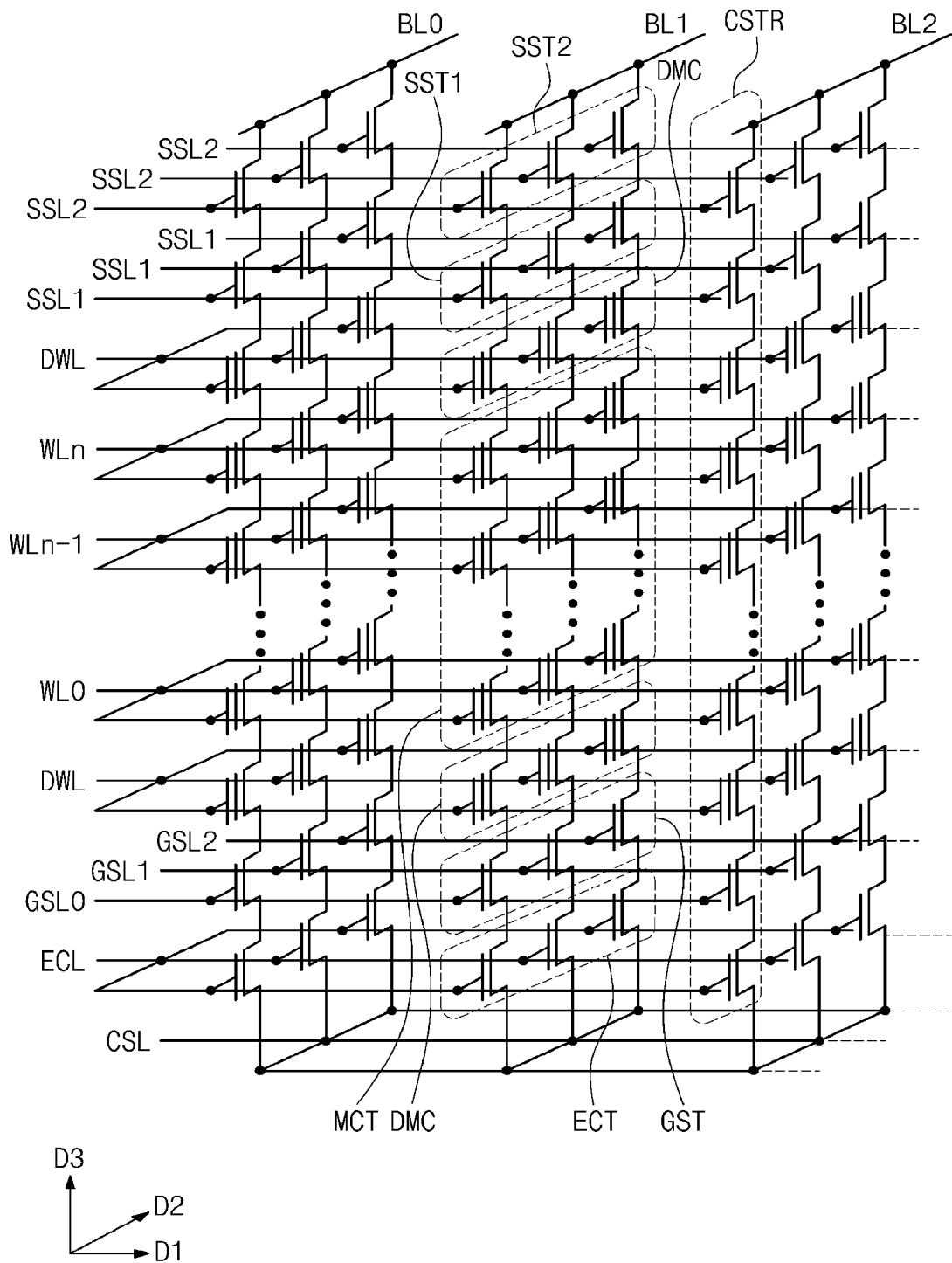
FIG. 1 is a schematic circuit diagram illustrating a cell array of a three-dimensional (3D) semiconductor memory device according to some embodiments of the inventive concepts.

FIG. 1 is a schematic circuit diagram illustrating a cell array of a three-dimensional (3D) semiconductor memory device according to some embodiments of the inventive concepts.

Referring to FIG. 1, a cell array of a 3D semiconductor memory device may include a common source line CSL, a plurality of bit lines BL0 to BL2, and a plurality of cell strings CSTR provided between the common source line CSL and the bit lines BL0 to BL2. Each of the cell strings CSTR may be formed as a NAND cell string comprising a plurality of memory cells MCT (e.g., memory cell transistors) connected in series.

The cell strings CSTR may be two-dimensionally arranged along first and second directions D1 and D2 and may extend along a third direction D3 extending from a plane that is parallel to the first and second directions D1 and D2. Each of the first, second, and third directions D1, D2, and D3 may be perpendicular to each other. The bit lines BL0 to BL2 may be spaced apart from each other in the first direction D1 and may extend in the second direction D2.

A plurality of the cell strings CSTR may be connected in parallel to each of the bit lines BL0 to BL2. The cell strings CSTR may be connected in common to the common source line CSL. For example, a plurality of the cell strings CSTR may be disposed between a corresponding one of the plurality of bit lines BL0 to BL2 and the same common source line CSL. In some embodiments, the common source line CSL may be provided in plurality, and the plurality of common source lines CSL may be two-dimensionally arranged. In some embodiments, the same voltage may be applied to the plurality of common source lines CSL. In some exemplary embodiments, each of the plurality of common source lines CSL may be supplied with a voltage and the common source lines CSL may be electrically controlled independently of each other.

In some embodiments, each of the cell strings CSTR may include string selection transistors SST1 and SST2 connected in series to each other, memory cell transistors MCT connected in series to each other, a ground selection transistor GST, and an erase control transistor ECT. Each of the memory cell transistors MCT may be a memory cell transistor and include a data storage element.

For example, each of the cell strings CSTR may include first and second string selection transistors SST1 and SST2 connected in series to each other, and the second string selection transistor SST2 may be connected to one of the bit lines BL0 to BL2. According to alternative exemplary embodiments, each of the cell strings CSTR may include a single string selection transistor. According to some exemplary embodiments, in each of the cell strings CSTR, the ground selection transistor GST may include a plurality of MOS transistors connected in series to each other, similarly to the first and second string selection transistors SST1 and SST2.

Each of the cell strings CSTR may include the plurality of memory cell transistors MCT respectively disposed at different distances from the common source line CSL. The memory cell transistors MCT may be connected in series between the first string selection transistor SST1 and the ground selection transistor GST. The erase control transistor ECT may be connected between the ground selection transistor GST and the common source line CSL. In addition, each of the cell strings CSTR may further include dummy cell transistors DMC which are connected between the first string selection transistor SST1 and an uppermost one of the memory cell transistors MCT and between the ground selection transistor GST and a lowermost one of the memory cell transistors MCT, respectively.

In some embodiments, the first string selection transistor SST1 may be controlled by a first string selection line SSL1, and the second string selection transistor SST2 may be controlled by a second string selection line SSL2. The memory cell transistors MCT may be controlled by word lines WL0 to WLn, respectively. The dummy cell transistors DMC may be controlled by dummy word lines DWL, respectively. The ground selection transistor GST may be controlled by a ground selection line GSL0, GSL1 or GSL2, and the erase control transistor ECT may be controlled by an erase control line ECL. The common source line CSL may be connected in common to sources of the erase control transistors ECT.

Gate electrodes of the memory cell transistors MCT (or the dummy cell transistors DMC) disposed at substantially the same level (or distance) from the common source line CSL may be connected in common to one of the word lines WL0 to WLn and DWL so as to be in an equipotential state. According to alternative exemplary embodiments, even though the gate electrodes of the memory cell transistors MCT are disposed at substantially the same level from the common source line CSL, the gate electrodes disposed in one row (or one column) may be controlled independently of the gate electrodes disposed in another row (or another column).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The ground selection lines GSL0 to GSL2 and the string selection lines SSL1 and SSL2 may extend in the first direction D1 and may be spaced apart from each other in the second direction D2. According to exemplary embodiments, the ground select lines GSL0 to GSL2 may be located at the same level as each other, the string select lines SSL1 may be located at the same level as each other and the string select lines SSL2 may be located at the same level as each other, and each of these lines may be electrically insulated from each other and constitute a separate electrical node. In addition, the erase control transistors ECT of the cell strings CSTR different from each other may be controlled in common by the erase control line ECL. The erase control transistors ECT may generate a gate induced drain leakage (GIDL) current in an erase operation of the cell array. According to some exemplary embodiments, in the erase operation of the cell array, an erase voltage may be applied to the bit line and/or the common source line CSL, and the GIDL current may be generated at the string selection transistor SST2 and/or the erase control transistor ECT.

According to exemplary embodiments, a dummy cell transistor DMC may be a memory cell connected to a word line that is not electrically activated to receive read and/or write voltages, and/or may be a memory cell whose data is ignored by a memory controller (e.g., not read out of the memory cell into a page buffer, in contrast to memory cells MCT that are not dummy memory cells). As such, whether or not data is stored in a dummy cell transistor DMC, the dummy cell transistor DMC may not function to result in communication of any data in such dummy cell transistors DMCs to a source external to the semiconductor memory device.

Figure 2:
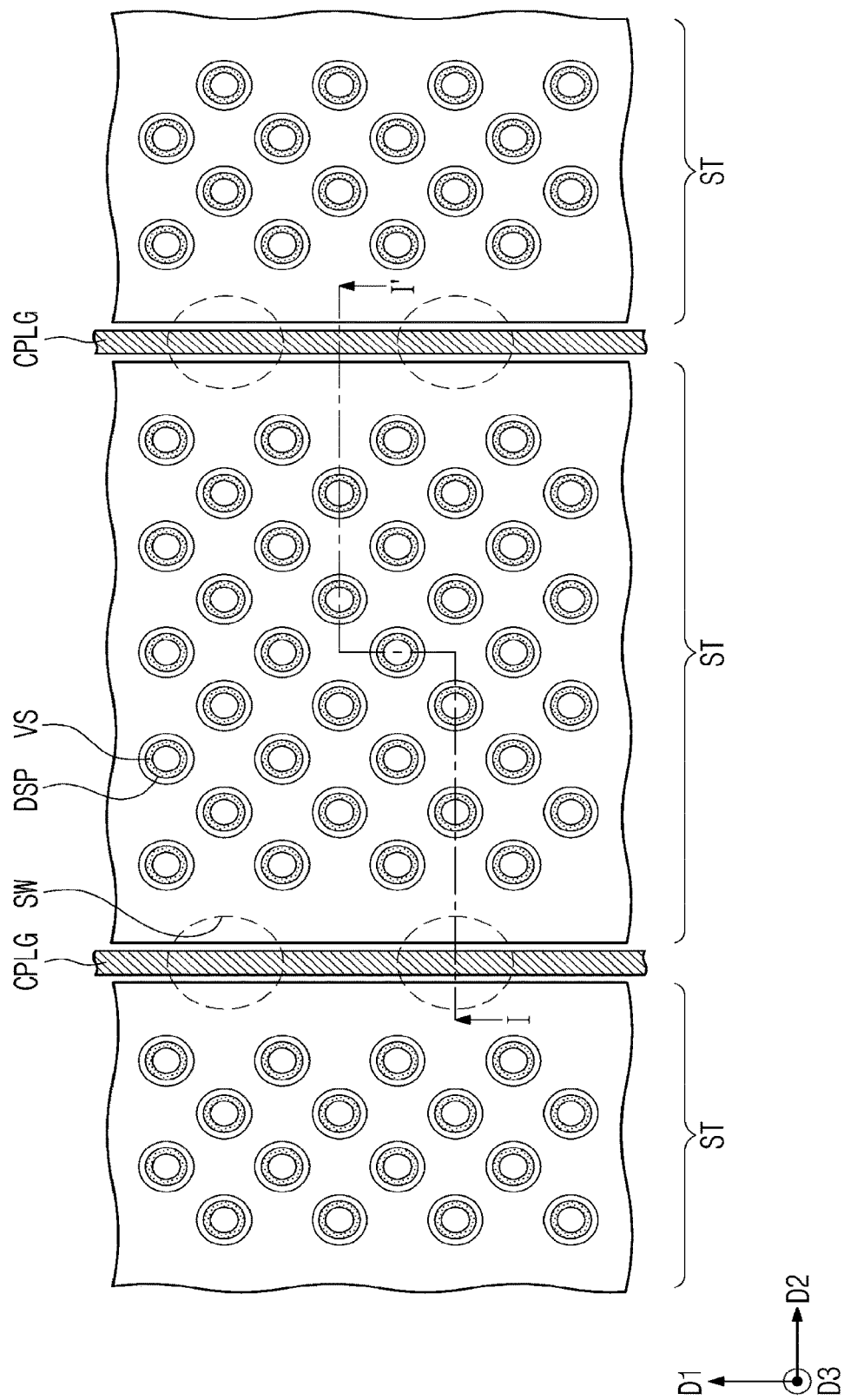
FIG. 2 is a plan view illustrating a 3D semiconductor memory device according to some embodiments of the inventive concepts.
Figure 3:
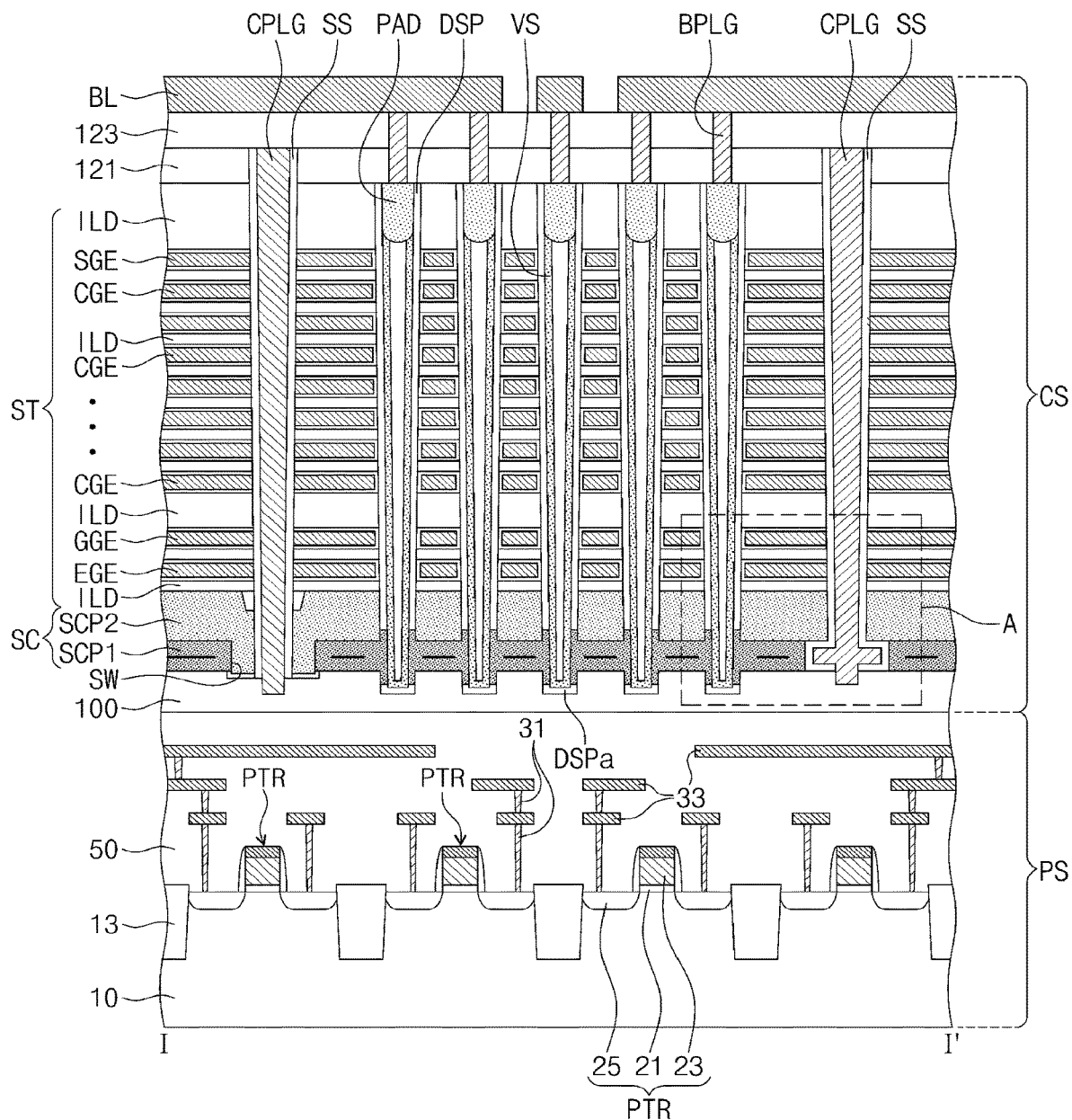
FIG. 3 is a cross-sectional view taken along a line I-I' of FIG. 2 to illustrate a 3D semiconductor memory device according to some embodiments of the inventive concepts.

FIG. 2 is a plan view illustrating a 3D semiconductor memory device according to some embodiments of the inventive concepts. FIG. 3 is a cross-sectional view taken along a line I-I' of FIG. 2 to illustrate a 3D semiconductor memory device according to some embodiments of the inventive concepts. FIGS. 4A to 4E are enlarged views of a portion 'A' of FIG. 3.

Referring to FIGS. 2 and 3, a 3D semiconductor memory device according to some embodiments may include a peripheral logic structure PS and a cell array structure CS disposed on the peripheral logic structure PS.

The peripheral logic structure PS may include peripheral logic circuits PTR integrated on a semiconductor substrate 10 and a lower insulating layer 50 covering the peripheral logic circuits PTR.

The semiconductor substrate 10 may be formed of a crystalline semiconductor material and may include a silicon substrate, a silicon-germanium substrate, a germanium substrate, or a single-crystalline epitaxial layer grown on a single-crystalline silicon substrate. The semiconductor substrate 10 may include active regions defined by a device isolation layer 13. The device isolation layer 13 may be trenches formed in the semiconductor substrate 10. Each of the active regions may be formed by doping charge carrier impurities into the semiconductor substrate 10. The device isolation layer 13 may include an insulating material, such as a silicon oxide layer.

The peripheral logic circuits PTR may include row and column decoders, a page buffer, and/or a control circuit. In more detail, the peripheral logic circuits PTR may include a peripheral gate insulating layer 21 on the semiconductor substrate 10, a peripheral gate electrode 23 on the peripheral gate insulating layer 21, and source/drain regions 25 disposed in the active region at both sides of the peripheral gate electrode 23.

Peripheral circuit interconnection lines 33 may be electrically connected to the peripheral logic circuits PTR through peripheral contact plugs 31. For example, the peripheral contact plugs 31 and the peripheral circuit interconnection lines 33 may be connected to NMOS and PMOS transistors.

The lower insulating layer 50 may be provided on an entire top surface of the semiconductor substrate 10. The lower insulating layer 50 may cover the peripheral logic circuits PTR, the peripheral contact plugs 31, and the peripheral circuit interconnection lines 33 on the semiconductor substrate 10. The lower insulating layer 50 may include a plurality of stacked insulating layers. For example, the lower insulating layer 50 may include at least one of a silicon oxide layer, a silicon nitride layer, a silicon oxynitride layer, or a low-k dielectric layer.

The cell array structure CS may be disposed on the lower insulating layer 50. The cell array structure CS may include a horizontal semiconductor layer 100, a source structure SC, electrode structures ST, vertical semiconductor patterns VS, and data storage patterns DSP. In some embodiments, the cell strings CSTR illustrated in FIG. 1 may be integrated on the horizontal semiconductor layer 100. The electrode structures ST, the vertical semiconductor patterns VS and the data storage patterns DSP may constitute the cell strings CSTR illustrated in FIG. 1.

In more detail, the horizontal semiconductor layer 100 may be disposed on a top surface of the lower insulating layer 50. The horizontal semiconductor layer 100 may be formed of or include a crystalline semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs) or a combination thereof. The horizontal semiconductor layer 100 may include a semiconductor material doped with charge carrier impurities (e.g., dopants of a first conductivity type (e.g., an N-type)) and/or may include an intrinsic semiconductor material with no doped charge carrier impurities. The horizontal semiconductor layer 100 may have a crystal structure including a single-crystalline structure, an amorphous structure, and/or a polycrystalline structure.

According to exemplary embodiments, each of the semiconductor substrate 10 and the horizontal semiconductor layer 100 and the elements formed thereon may be a semiconductor chip and may be formed and cut from a wafer. In addition, according to exemplary embodiments, the bonding of these substrates/chips can be done at the wafer level (e.g., bonding wafer A with semiconductor substrate 10 to wafer B with the horizontal semiconductor layer 100) and then cutting the bonded wafers.

The source structure SC may be disposed between each of the electrode structures ST and the horizontal semiconductor layer 100. The source structure SC may be parallel to the top surface of the horizontal semiconductor layer 100 and may extend in a first direction D1 in parallel to the electrode structure ST. The source structure SC may include first and second source conductive patterns SCP1 and SCP2 which are sequentially stacked. A thickness of the first source conductive pattern SCP1 may be less than that of the second source conductive pattern SCP2. For example, a maximum thickness of the first source conductive pattern SCP1 in a direction perpendicular to the top surface of the horizontal semiconductor layer 100 may be less than a maximum thickness of the second source conductive pattern SCP2 in the direction perpendicular to the top surface of the horizontal semiconductor layer 100. The first source conductive pattern SCP1 may be in contact with the horizontal semiconductor layer 100, and the second source conductive pattern SCP2 may contact a top surface of the first source conductive pattern SCP1. It will be understood that when an element is referred to as contacting another element, there are no intervening elements present at the point of contact. In certain embodiments, an insulating layer (not shown) may be disposed between the first source conductive pattern SCP1 and the horizontal semiconductor layer 100.

The first and second source conductive patterns SCP1 and SCP2 may be formed of a semiconductor material doped with dopants having the first conductivity type, e.g., phosphorus (P) or arsenic (As). In some embodiments, the first and second source conductive patterns SCP1 and SCP2 may be formed of a semiconductor material doped with N-type dopants, and a concentration of the N-type dopants in the first source conductive pattern SCP1 may be greater than a concentration of the N-type dopants in the second source conductive pattern SCP2.

The first source conductive pattern SCP1 may have recessed sidewalls SW at portions thereof. The recessed sidewalls SW of the first source conductive pattern SCP1 may be spaced apart from each other in the first direction D1. The first source conductive pattern SCP1 may include first portions having a first width in a second direction D2 intersecting the first direction D1 and second portions having a second width in the second direction D2. In this exemplary embodiment, the second width may be greater than the first width. The second source conductive pattern SCP2 may extend from the top surface of the first source conductive pattern SCP1 onto the recessed sidewalls SW of the first source conductive pattern SCP1. A portion of the second source conductive pattern SCP2 may have a bottom surface lower than a bottom surface of the first source conductive pattern SCP1. An insulating layer may be disposed between the portion of the second source conductive pattern SCP2 and the horizontal semiconductor layer 100. According to alternative embodiments, the portion of the second source conductive pattern SCP2 may contact the horizontal semiconductor layer 100 when no insulating layer is formed between the portion of the second source conductive pattern SCP2 and the horizontal semiconductor layer 100.

The electrode structure ST may be disposed on the source structure SC. The electrode structure ST may extend in the first direction D1 and may be disposed between a pair of common source plugs CPLG extending in the first direction D1. Insulating spacers SS formed of an insulating material may be disposed between the electrode structure ST and the common source plugs CPLG.

The electrode structure ST may include insulating layers ILD and electrodes EGE, GGE, CGE and SGE, which are alternately stacked in a third direction D3 (i.e., a vertical direction) perpendicular to the first and second directions D1 and D2. For example, the electrodes EGE, GGE, CGE and SGE may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). Each of the insulating layers ILD may include a silicon oxide layer and/or a low-k dielectric layer. In some embodiments, the electrodes EGE, GGE, CGE and SGE may include an erase control gate electrode EGE adjacent to the source structure SC, a ground selection gate electrode GGE on the erase control gate electrode EGE, a plurality of cell gate electrodes CGE sequentially stacked on the ground selection gate electrode GGE, and a string selection gate electrode SGE on an uppermost one of the cell gate electrodes CGE.

The erase control gate electrode EGE may be adjacent to the source structure SC and may be used as gate electrodes of the erase control transistors ECT (see FIG. 1) controlling an erase operation of a memory cell array. The erase control gate electrode EGE may be used as the gate electrodes of the erase control transistors ECT (see FIG. 1) which are used to generate the gate induced drain leakage (GIDL) current. The ground selection gate electrode GGE may be used as gate electrodes of the ground selection transistors GST (see FIG. 1) which control electrical connection between the common source line CSL (see FIG. 1) and the vertical semiconductor patterns VS. The cell gate electrodes CGE may be used as control gate electrodes (e.g., WL0 to WLn and DWL of FIG. 1) of the memory and dummy cell transistors MCT and DMC of FIG. 1. The string selection gate electrode SGE corresponding to an uppermost one of the electrodes EGE, GGE, CGE and SGE may be used as gate electrodes of the string selection transistors SST2 (see FIG. 1) which control electrical connection between bit lines BL and the vertical semiconductor patterns VS. In this exemplary embodiment, the first string selection transistors SST1 of FIG. 1 are omitted. According to an alternative embodiment, the electrode structure ST may further include an additional string selection gate electrode used as gate electrodes of the first string selection transistors SST1 of FIG. 1. In some embodiments, thicknesses of the insulating layers ILD in a direction perpendicular to the top surface of the horizontal semiconductor layer 100 between the cell gate electrodes CGE may be substantially equal to each other. According to exemplary embodiments, the thickness of the insulating layer ILD between the ground selection gate electrode GGE and a lowermost one of the cell gate electrodes CGE in the direction perpendicular to the top surface of the horizontal semiconductor layer 100 may be thicker than the thicknesses of other insulating layers ILD in the direction perpendicular to the top surface of the horizontal semiconductor layer 100.

The vertical semiconductor patterns VS may extend in the third direction D3 substantially perpendicular to the top surface of the horizontal semiconductor layer 100 penetrating the electrode structure ST and the source structure SC. Portions of sidewalls of the vertical semiconductor patterns VS may be in contact with the source structure SC, and thus the vertical semiconductor patterns VS may be electrically connected to the source structure SC. As used herein, and unless indicated otherwise, items described as being "electrically connected" are configured such that an electrical signal can be passed from one item to the other. Bottom surfaces of the vertical semiconductor patterns VS may be disposed at a lower level than the bottom surface of the first source conductive pattern SCP1.

The vertical semiconductor patterns VS may be arranged in a line or in a zigzag form in one direction when viewed in a plan view. Each of the vertical semiconductor patterns VS may have a pipe or macaroni shape of which a bottom end is closed. The vertical semiconductor patterns VS may include a semiconductor material such as silicon (Si), germanium (Ge), or a combination thereof. In addition, the vertical semiconductor patterns VS may include a semiconductor material doped with charge carrier impurities or an intrinsic semiconductor material with no doped charge carrier impurities. The vertical semiconductor patterns VS may include a poly-crystalline semiconductor material. The vertical semiconductor patterns VS including the semiconductor material may be used as channel regions of the erase control, string selection, ground selection and memory cell transistors ECT, SST2, GST and MCT described with reference to FIG. 1.

A bit line conductive pad PAD may be formed on a top end of each of the vertical semiconductor patterns VS. The bit line conductive pad PAD may be a dopant region doped with dopants or may be formed of a conductive material.

The data storage pattern DSP may be disposed between the electrode structure ST and each of the vertical semiconductor patterns VS. The data storage pattern DSP may extend in the third direction D3 and may surround the sidewall of each of the vertical semiconductor patterns VS. For example, the data storage pattern DSP may have a pipe or macaroni shape of which top and bottom ends are opened. In some embodiments, the data storage pattern DSP may be disposed on the source structure SC.

A dummy data storage pattern DSPa may be vertically spaced apart from the data storage pattern DSP and may be disposed in the horizontal semiconductor layer 100. The dummy data storage pattern DSPa may have a cross section which has a substantial U-shape, and the vertical semiconductor pattern VS may be spaced apart from the horizontal semiconductor layer 100 by the dummy data storage pattern DSPa.

A first interlayer insulating layer 121 may be disposed on the electrode structures ST. The common source plugs CPLG may penetrate the first interlayer insulating layer 121 and may be disposed on both sidewalls of the electrode structure ST and both sidewalls of the source structure CS. Each of common source regions CSR may be provided in the horizontal semiconductor layer 100 between the electrode structures ST adjacent to each other. The common source regions CSR may include N-type dopants and may extend in parallel to the electrode structures ST in the first direction D1. In some embodiments, the common source regions CSR may be omitted.

The common source plug CPLG may be connected to the common source region CSR between the electrode structures ST. The common source plug CPLG may be electrically connected to the source structure SC. For example, the common source plugs CPLG may include at least one of a metal (e.g., tungsten, copper, or aluminum), a conductive metal nitride (e.g., titanium nitride or tantalum nitride), or a transition metal (e.g., titanium or tantalum). In some embodiments, the common source plug CPLG may have a substantially uniform upper width and may extend in the first direction D1. The insulating spacers SS formed of an insulating material may be disposed between the electrode structure ST and the common source plugs CPLG.

A second interlayer insulating layer 123 may be disposed on the first interlayer insulating layer 121 and may cover top surfaces of the common source plugs CPLG. Bit lines BL may be disposed on the second interlayer insulating layer 123 and may extend in the second direction D2. The bit lines BL may be electrically connected to the bit line conductive pads PAD through bit line contact plugs BPLG.

Referring to FIGS. 2, 3 and 4A to 4E, in some embodiments, the first source conductive pattern SCP1 may contact the portions of the sidewalls of the vertical semiconductor patterns VS. The first source conductive pattern SCP1 may include a horizontal portion HP and a sidewall portion SP. The horizontal portion HP may be substantially parallel to the top surface of the horizontal semiconductor layer 100 under the electrode structure ST and may extend in the first direction D1 in parallel to the electrode structure ST. The sidewall portion SP may extend from the horizontal portion HP in the third direction D3 perpendicular to the top surface of the horizontal semiconductor layer 100 and may surround the portion of the sidewall of each of the vertical semiconductor patterns VS.

A top surface of the horizontal portion HP of the first source conductive pattern SCP1 may be in contact with a bottom surface of the second source conductive pattern SCP2, and a bottom surface of the horizontal portion HP of the first source conductive pattern SCP1 may be in contact with the horizontal semiconductor layer 100. The sidewall portion SP of the first source conductive pattern SCP1 may cover a portion of a sidewall of the second source conductive pattern SCP2 and a portion of a sidewall of the horizontal semiconductor layer 100. In addition, the horizontal portion HP of the first source conductive pattern SCP1 may include a lower portion LP adjacent to the top surface of the horizontal semiconductor layer 100, and an upper portion UP adjacent to the bottom surface of the second source conductive pattern SCP2.

A top surface of the sidewall portion SP of the first source conductive pattern SCP1 may be located at a lower level than a bottom surface of the erase control gate electrode EGE. In some embodiments, the top surface of the sidewall portion SP of the first source conductive pattern SCP1 may be located at a level between the top surface and the bottom surface of the second source conductive pattern SCP2. According to alternative exemplary embodiments, the top surface of the sidewall portion SP of the first source conductive pattern SCP1 may be located at a higher level than the top surface of the second source conductive pattern SCP2. A bottom surface of the sidewall portion SP of the first source conductive pattern SCP1 may be located at a level which is lower than the top surface of the horizontal semiconductor layer 100 and is higher than a bottom surface of the vertical semiconductor pattern VS. According to some exemplary embodiments, the top and bottom surfaces of the sidewall portion SP of the first source conductive pattern SCP1 may be curve-shaped. For example, the portions of the curved-shaped top surface of the sidewall portion SP of the first source conductive pattern SCP1 adjacent to the sidewalls of the second source conductive pattern SCP2 may be positioned at a level higher than the portions of the curved-shaped top surface of the sidewall portion SP of the first source conductive pattern SCP1 adjacent to the sidewalls of the vertical semiconductor patterns VS and the portions of the curved-shaped bottom surface of the sidewall portion SP of the first source conductive pattern SCP1 adjacent to the sidewalls of the horizontal semiconductor layer 100 may be positioned at a level lower than the portions of the curved-shaped bottom surface of the sidewall portion SP of the first source conductive pattern SCP1 adjacent to the sidewalls of the vertical semiconductor patterns VS.

According some embodiments, the material of the first source conductive pattern SCP1 may be discontinuous in the third direction D3 between the horizontal semiconductor layer 100 and the second source conductive pattern SCP2. Thus, the horizontal portion HP of the first source conductive pattern SCP1 may include a discontinuous interface S between the top surface of the horizontal semiconductor layer 100 and the bottom surface of the second source conductive pattern SCP2. For example, where the first source conductive pattern SCP1 is formed of a crystalline structure, the discontinuous interface S between the top surface of the horizontal semiconductor layer 100 and the bottom surface of the second source conductive pattern SCP2 may be a break or an abnormality in the crystalline structure. The discontinuous interface S may mean any discrepancy from the main material of the first source conductive pattern SCP1 that may be detectable by an analysis apparatus (e.g., a transmission electron microscope (TEM) or a scanning electron microscope (SEM)). For example, the discontinuous interface S may mean a composition difference of a material that may be detectable by the analysis apparatus (e.g., the TEM or the SEM), a grain difference of a material that may be detectable by the analysis apparatus (e.g., the TEM or the SEM), a void that may be detectable by the analysis apparatus (e.g., the TEM or the SEM), and/or existence of a foreign material detectable that may be detectable by the analysis apparatus (e.g., the TEM or the SEM), the foreign material being different from the material that forms first source conductive pattern SCP1, such as a different solid material, or a gaseous material that forms a void.

Figure 4A:
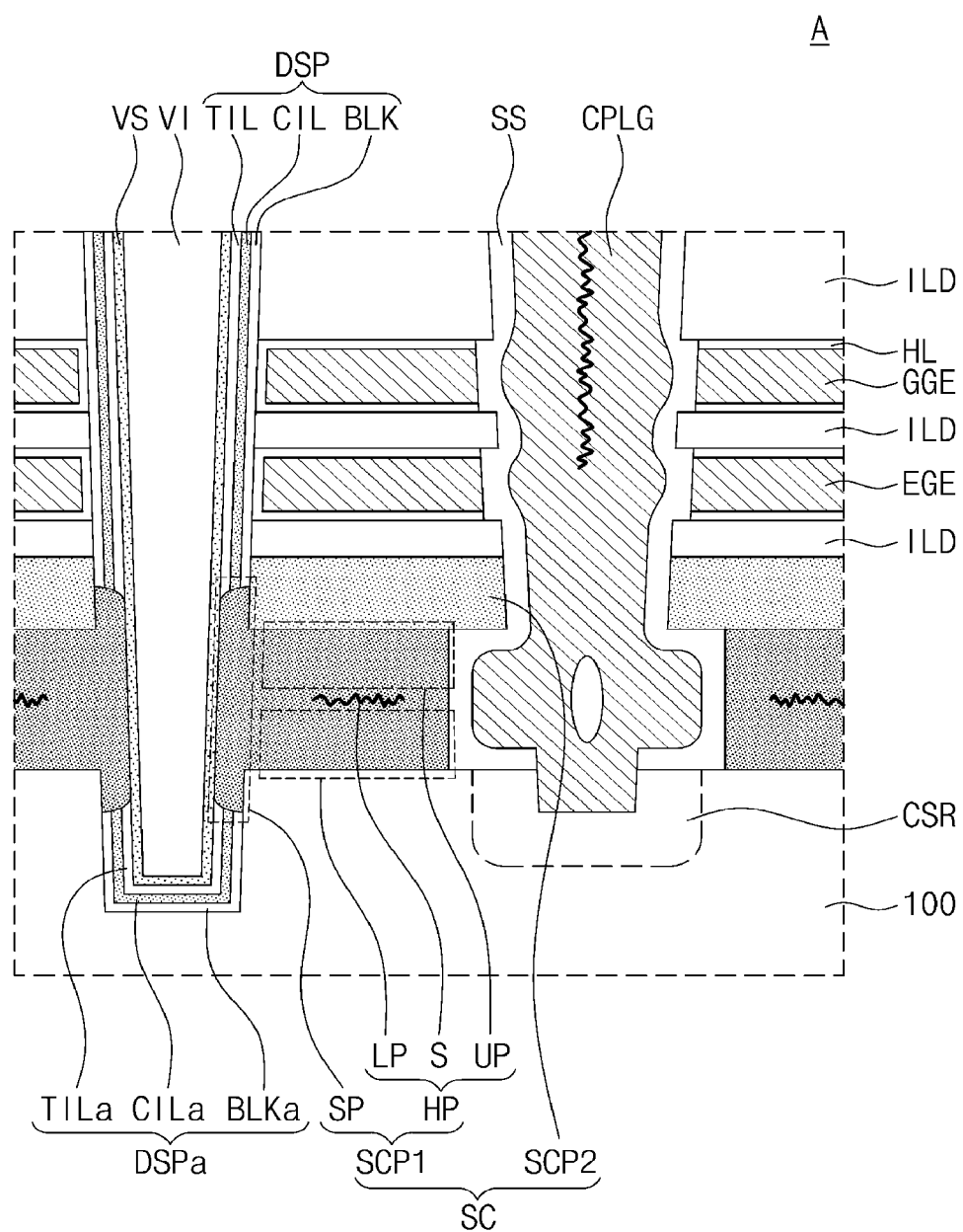
FIGS. 4A to 4E are enlarged views of a portion 'A' of FIG. 3.
Figure 4B:
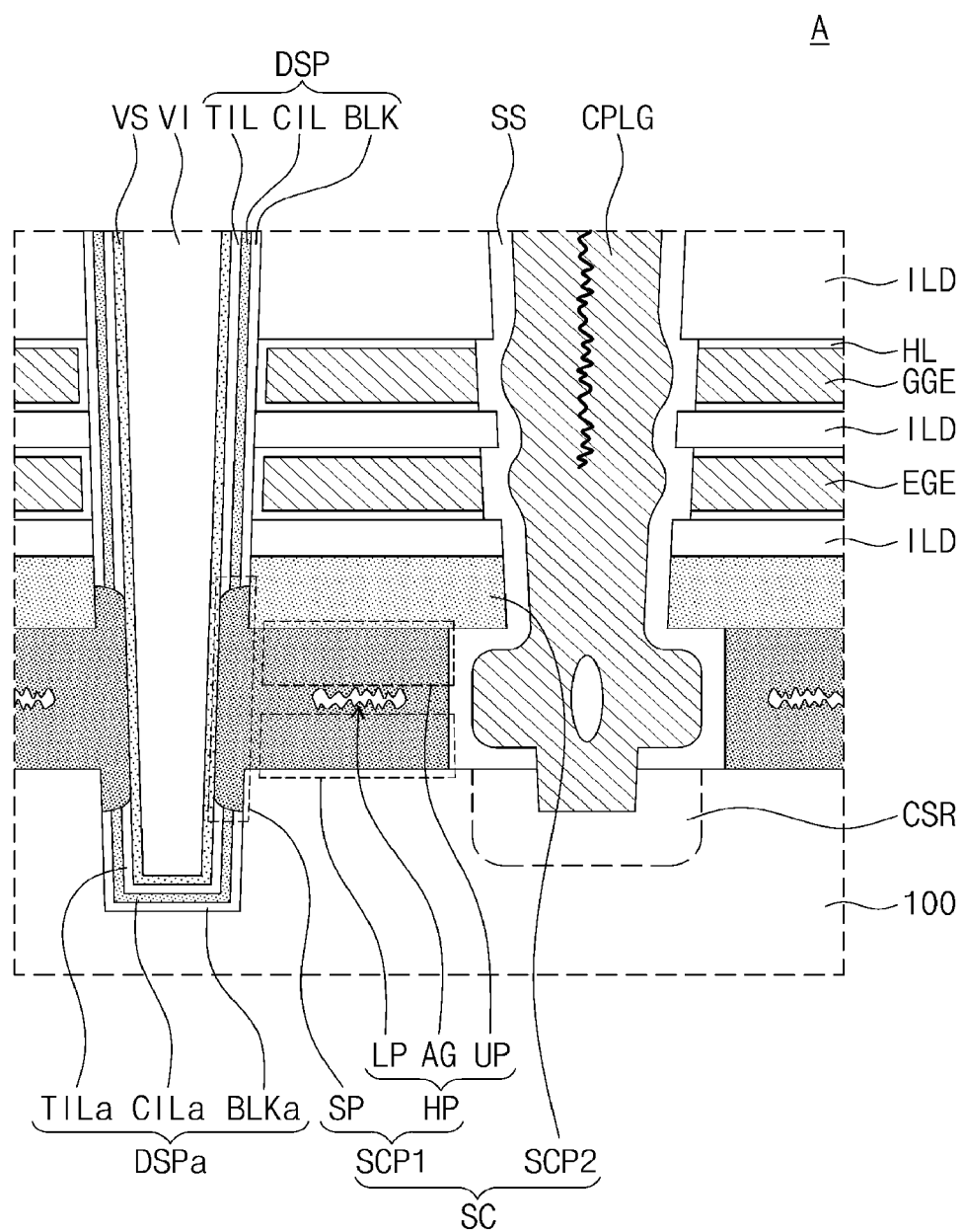
Figure 4C:
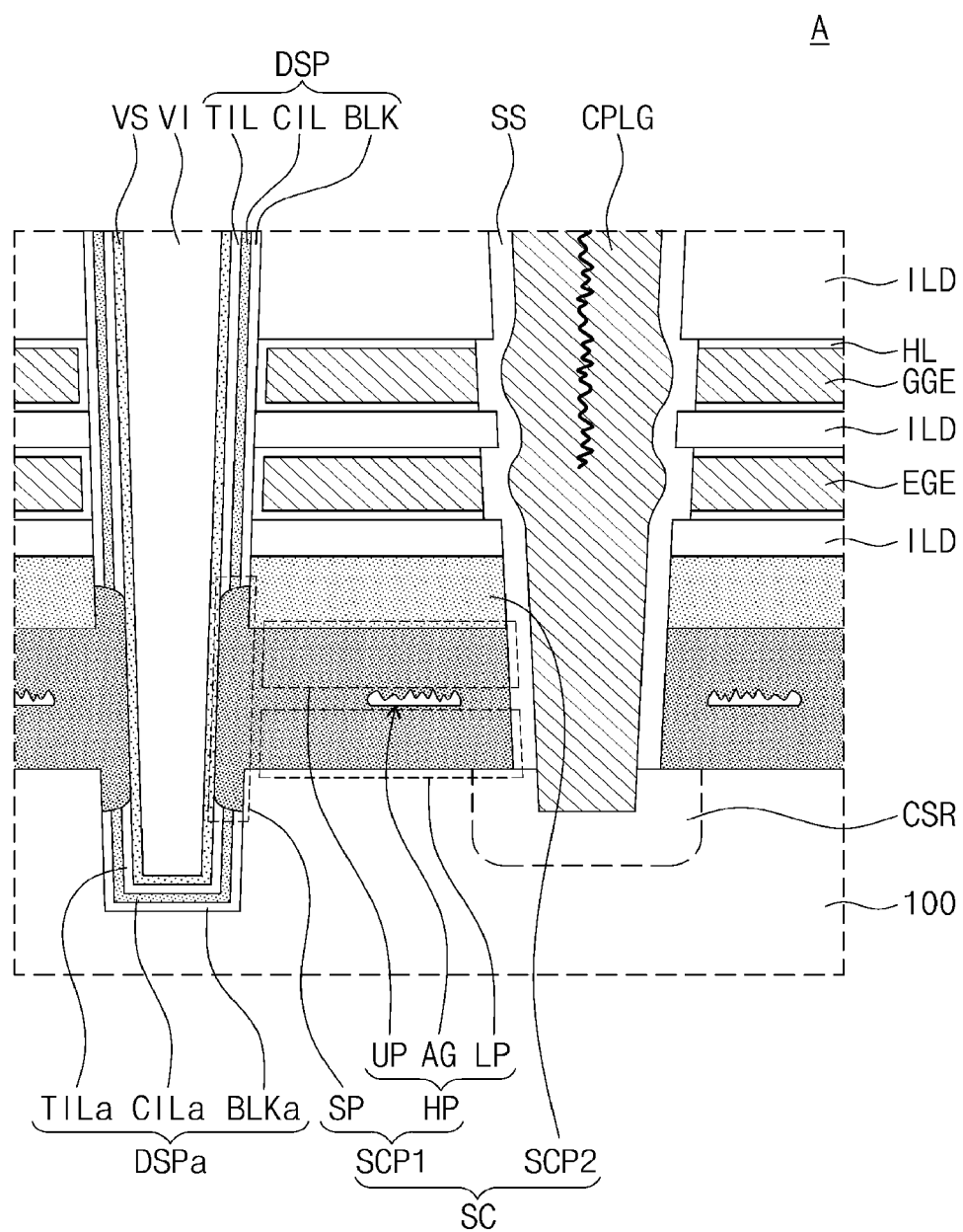
Figure 4D:
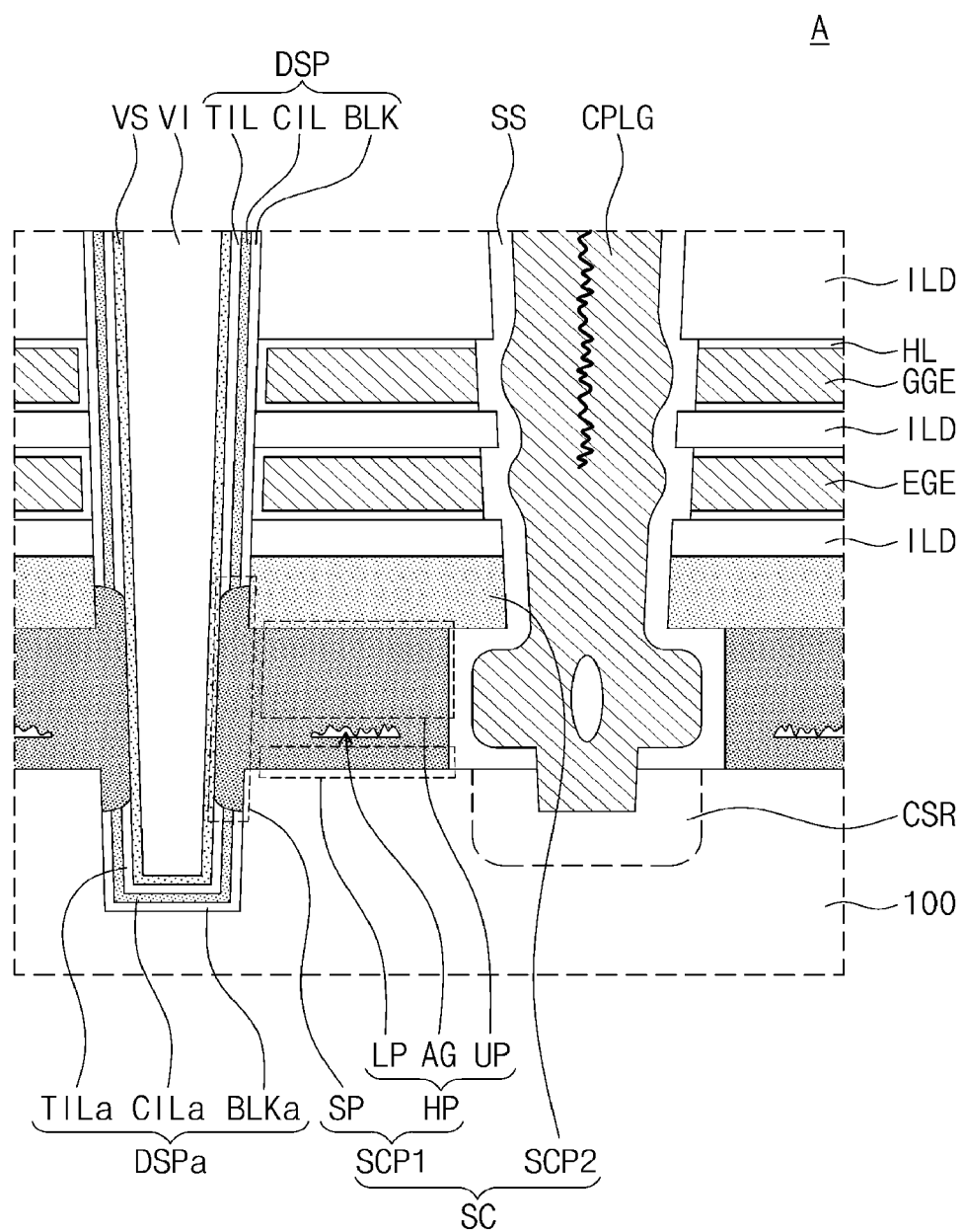
Figure 4E:
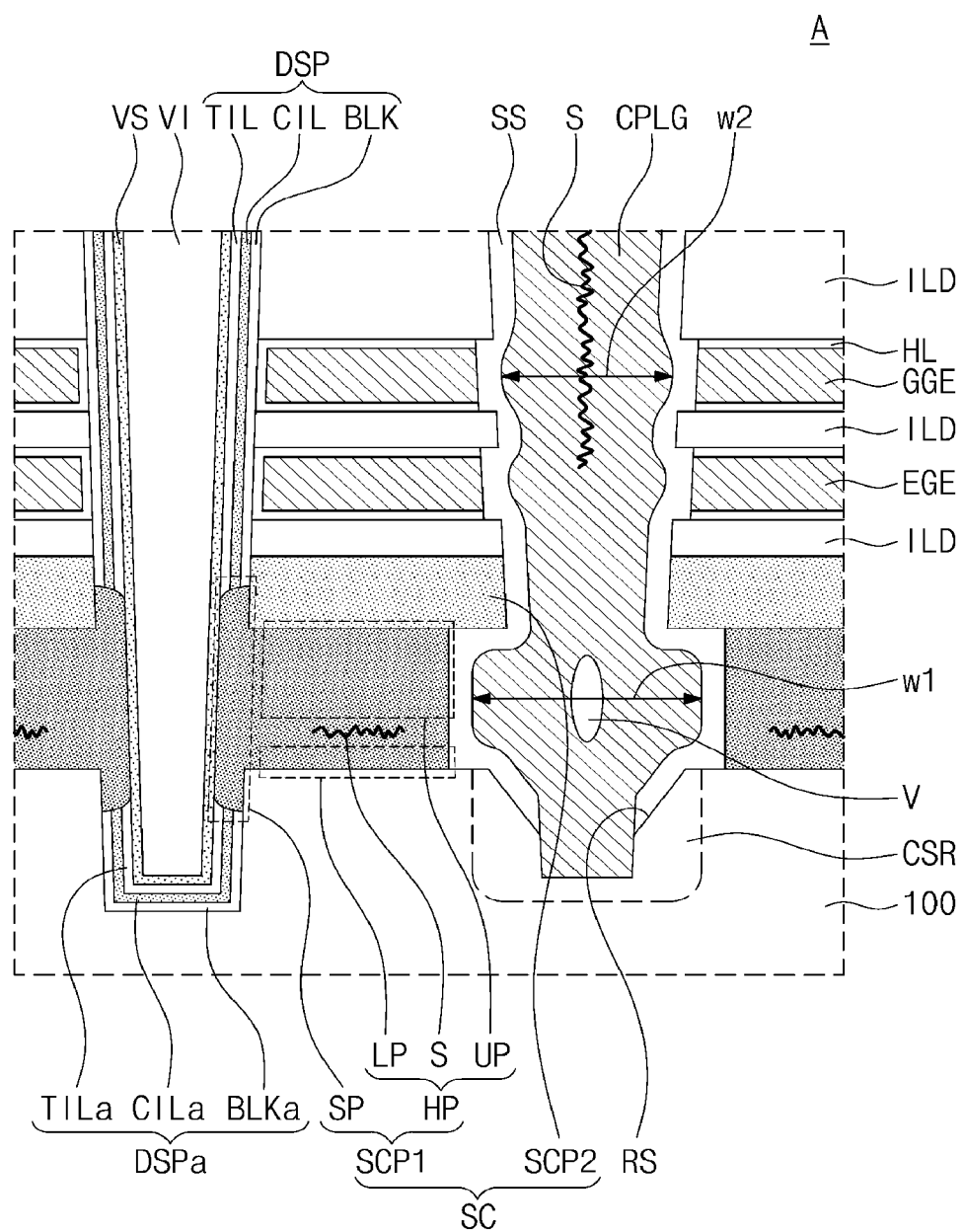

Referring to FIGS. 4A and 4E, the discontinuous interface S may be formed between the lower portion LP and the upper portion UP by a difference in crystal structure of the material. The discontinuous interface S may be spaced apart from the top surface of the horizontal semiconductor layer 100 and the bottom surface of the second source conductive pattern SCP2. The discontinuous interface S may be horizontally spaced apart from the vertical semiconductor pattern VS and the insulating spacer SS.

Referring to FIGS. 4B, 4C and 4D, the horizontal portion HP of the first source conductive pattern SCP1 may include an air gap AG or a void defined between the lower portion LP and the upper portion UP. The air gap AG may be spaced apart from the top surface of the horizontal semiconductor layer 100 and the bottom surface of the second source conductive pattern SCP2. The air gap AG may be horizontally spaced apart from the vertical semiconductor pattern VS and the insulating spacer SS. The term "air" as discussed herein, may refer to atmospheric air, or other gases that may be present during the manufacturing process.

In some embodiments, the upper portion UP and the lower portion LP of the first source conductive pattern SCP1 may be formed of semiconductor materials having different crystal structures from each other. For an example, the upper portion UP may be formed of amorphous silicon, and the lower portion LP may be formed of single-crystalline or poly-crystalline silicon. For another example, the upper portion UP may be formed of poly-crystalline silicon, and the lower portion LP may be formed of single-crystalline or amorphous silicon. For still another example, the upper and lower portions UP and LP may be formed of poly-crystalline silicon, and an average grain size of the upper portion UP may be different from an average grain size of the lower portion LP. In certain embodiments, the upper portion UP and the lower portion LP of the first source conductive pattern SCP1 may be formed of semiconductor materials having the same crystal structure. For example, both the upper and lower portions UP and LP may be formed of poly-crystalline silicon or may be formed of amorphous silicon.

The discontinuous interface S or the air gap AG may be vertically spaced apart from the top surface of the horizontal semiconductor layer 100 by a first distance and may be vertically spaced apart from the bottom surface of the second source conductive pattern SCP2 by a second distance. Here, the second distance may be substantially equal to or different from the first distance. In addition, a surface roughness of the upper portion UP exposed by the air gap AG may be different from a surface roughness of the lower portion LP exposed by the air gap AG. According to exemplary embodiments, the surface roughness of the upper portion UP exposed by the air gap AG the surface roughness of the lower portion LP exposed by the air gap AG may be calculated as an arithmetic mean roughness (Ra).

Referring to FIG. 4D, the discontinuous interface S or the air gap AG may be closer to the top surface of the horizontal semiconductor layer 100 than to the bottom surface of the second source conductive pattern SCP2. According to alternative exemplary embodiments, the discontinuous interface S or the air gap AG may be closer to the bottom surface of the second source conductive pattern SCP2 than to the top surface of the horizontal semiconductor layer 100.

Referring to FIG. 4E, the horizontal semiconductor layer 100 may have a recess region RS under the common source plug CPLG. The recess region RS may be defined by sidewalls inclined with respect to the top surface of the horizontal semiconductor layer 100. In some embodiments, the inclined sidewalls defining the recess region RS may have a (100) crystal plane or a (111) crystal plane. In some embodiments, the first source conductive pattern SCP1 may completely fill a space between the horizontal semiconductor layer 100 and the second source conductive pattern SCP2 without the discontinuous interface S or the air gap AG.

Referring to FIGS. 4A to 4E, the data storage pattern DSP may be disposed on the sidewall portion SP of the first source conductive pattern SCP1. The data storage pattern DSP may extend from between the vertical semiconductor pattern VS and the second source conductive pattern SCP2 into between the electrode structure ST and the vertical semiconductor pattern VS. A thickness of the data storage pattern DSP on the sidewall of the vertical semiconductor pattern VS may be substantially equal to a thickness of the sidewall portion SP of the first source conductive pattern SCP1. A bottom surface of the data storage pattern DSP may be disposed at a level between the top surface and the bottom surface of the second source conductive pattern SCP2. According to alternative exemplary embodiments, the bottom surface of the data storage pattern DSP may be disposed at a level between the top surface of the second source conductive pattern SCP2 and the bottom surface of the erase control gate electrode EGE.

The data storage pattern DSP may include a single layer or a plurality of layers. In some embodiments, the data storage pattern DSP may be a data storage layer of a NAND flash memory device and may include a tunnel insulating layer TIL, a charge storage layer CIL and a blocking insulating layer BLK, which are sequentially stacked on the sidewall of the vertical semiconductor pattern VS. For example, the charge storage layer CIL may include a trap insulating layer, a floating gate electrode, and/or an insulating layer including conductive nano dots. In more detail, the charge storage layer CIL may include at least one of a silicon nitride layer, a silicon oxynitride layer, a silicon-rich nitride layer, a nano-crystalline silicon layer, or a laminated trap layer. The tunnel insulating layer TIL may include at least one of materials having energy band gaps greater than that of the charge storage layer CIL, and the blocking insulating layer BLK may include a high-k dielectric layer such as an aluminum oxide layer or a hafnium oxide layer. According to exemplary embodiments, the charge storage layer CIL is disposed between the tunnel insulating layer TIL and the blocking insulating layer BLK.

A horizontal insulating pattern HL may be provided between the data storage pattern DSP and one sidewall of each of the electrodes EGE, GGE, CGE and SGE. The horizontal insulating pattern HL may extend from the one sidewall of each of the electrodes EGE, GGE, CGE and SGE onto top and bottom surfaces of each of the electrodes EGE, GGE, CGE and SGE. The horizontal insulating pattern HL may be a portion of the data storage layer of the NAND flash memory device. For example, the horizontal insulating pattern HL may include a charge storage layer and/or a blocking insulating layer.

The dummy data storage pattern DSPa may have substantially the same layer structure as the data storage pattern DSP. For example, the dummy data storage pattern DSPa may include a tunnel insulating layer TILa, a charge storage layer CILa, and a blocking insulating layer BLKa, which are sequentially stacked on the bottom surface and the sidewall of the vertical semiconductor pattern VS.

The dummy data storage pattern DSPa may be disposed between the bottom surface of the vertical semiconductor pattern VS and the horizontal semiconductor layer 100. A top surface of the dummy data storage pattern DSPa may be disposed at a lower level than the top surface of the horizontal semiconductor layer 100.

Referring to FIGS. 4A to 4E, a sidewall of the first source conductive pattern SCP1 adjacent to the common source plug CPLG may be laterally recessed from a sidewall of the erase control gate electrode EGE adjacent to the common source plug CPLG. The common source plug CPLG may include a first portion adjacent to the first source conductive pattern SCP1 and a second portion adjacent to the electrodes EGE, GGE, CGE and SGE. Here, a width of the first portion of the common source plug CPLG may be greater than a width of the second portion of the common source plug CPLG. For example, a maximum width w1 of the first portion of the common source plug CPLG in a direction parallel to the top surface of the horizontal semiconductor layer 100 may be greater than a maximum width w2 of the second portion of the common source plug CPLG in the direction parallel to the top surface of the horizontal semiconductor layer 100. In addition, a void V may be formed in the first portion of the common source plug CPLG, and a seam S may be formed in the second portion of the common source plug CPLG.

In an erase operation of the 3D semiconductor memory device according to some embodiments of the inventive concepts, an erase voltage Vera may be applied to the first source conductive pattern SCP1 to generate a great potential difference between the erase control gate electrode EGE and the first source conductive pattern SCP1. A ground voltage or a negative voltage may be applied to the erase control gate electrode EGE. Thus, a GIDL phenomenon may be generated in the vicinity of the sidewall portion SP of the first source conductive pattern SCP1 adjacent to the erase control gate electrode EGE. For example, a depletion layer may be induced in the vicinity of the sidewall portion SP of the first source conductive pattern SCP1 adjacent to the erase control gate electrode EGE, and electron-hole pairs may be generated in the depletion layer. Since the high erase voltage is applied to the first source conductive pattern SCP1, electrons may be attracted to the first source conductive pattern SCP1, and holes may be provided into the vertical semiconductor pattern VS so as to be accumulated in the vertical semiconductor pattern VS adjacent to the electrode structure ST. Since the holes are accumulated in the vertical semiconductor pattern VS, charges trapped in the memory cell transistors may be discharged to the vertical semiconductor pattern VS. As a result, data stored in the memory cell transistors may be erased.

Figure 5:
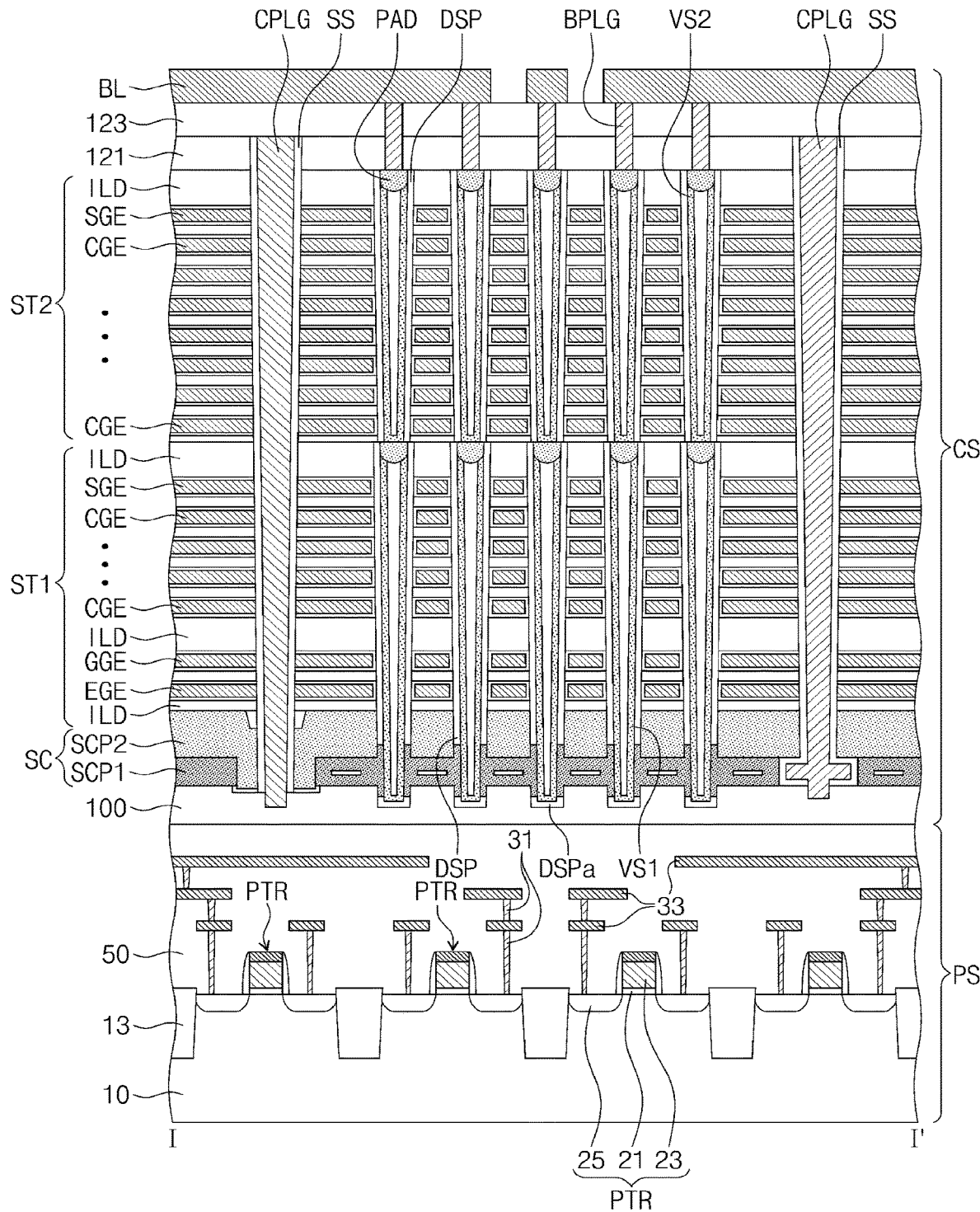
FIGS. 5 and 6 are cross-sectional views illustrating 3D semiconductor memory devices according to some embodiments of the inventive concepts.
Figure 6:
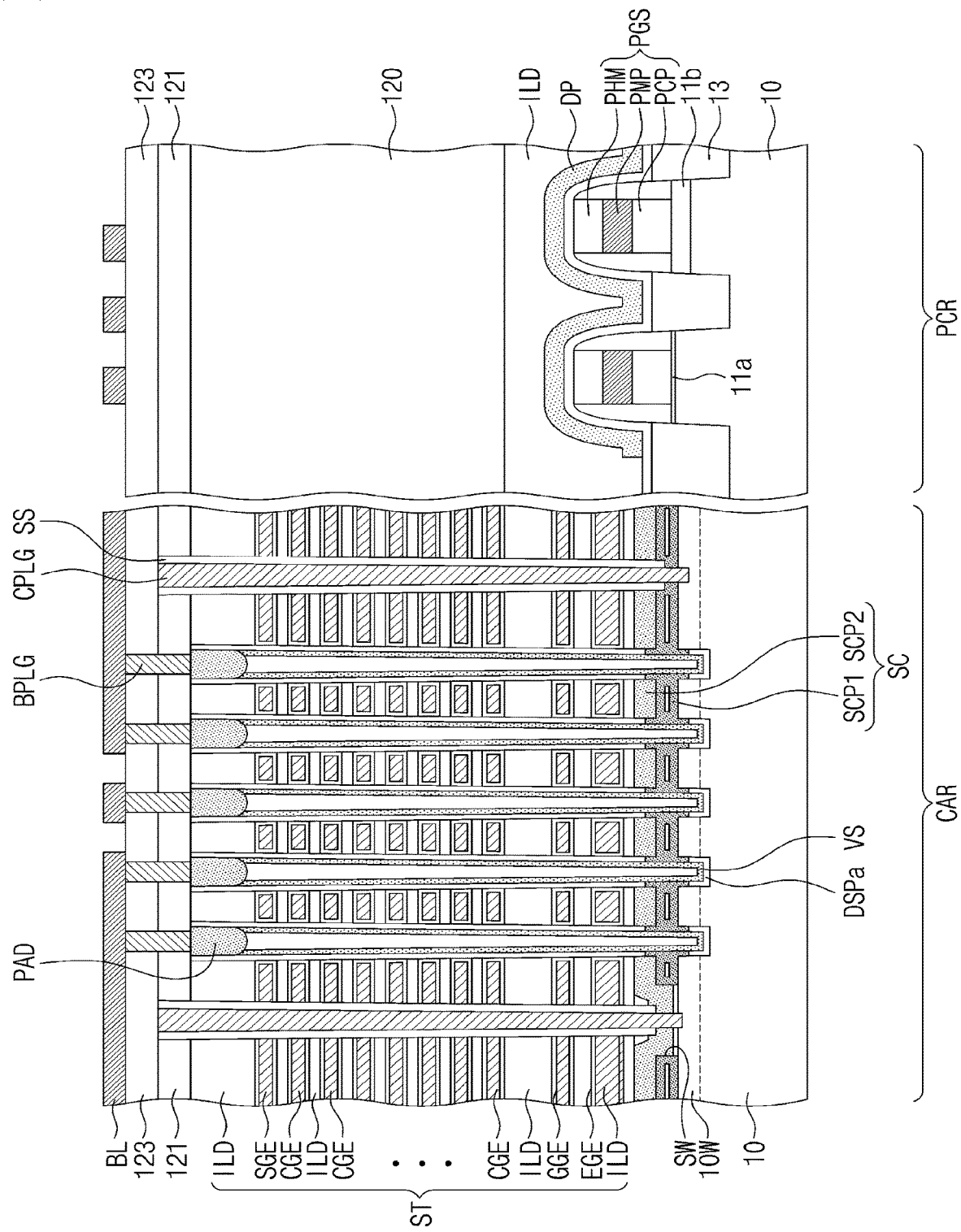

FIGS. 5 and 6 are cross-sectional views illustrating 3D semiconductor memory devices according to some embodiments of the inventive concepts. For the purpose of ease and convenience in explanation, the descriptions to the same technical features as in the above embodiments will be omitted, and differences between the present embodiments and the above embodiments will be mainly described hereinafter.

Referring to FIG. 5, a 3D semiconductor memory device may include a peripheral logic structure PS and a cell array structure CS disposed on the peripheral logic structure PS. The cell array structure CS may include a source structure SC on a horizontal semiconductor layer 100, a first electrode structure ST1 on the source structure SC, first vertical semiconductor patterns VS1 penetrating the first electrode structure ST1, a second electrode structure ST2 on the first electrode structure ST1, and second vertical semiconductor patterns VS2 penetrating the second electrode structure ST2.

The first vertical semiconductor patterns VS1 may penetrate the first electrode structure ST1 so as to be connected to the source structure SC. The first vertical semiconductor patterns VS1 may have substantially the same features as the vertical semiconductor patterns VS described above. For example, portions of sidewalls of the first vertical semiconductor patterns VS1 may be connected to the source structure SC. First conductive pads PAD may be provided on top ends of the first vertical semiconductor patterns VS1. The second vertical semiconductor patterns VS2 may penetrate the second electrode structure ST2 so as to be electrically connected to the first vertical semiconductor patterns VS1. The second vertical semiconductor patterns VS2 may be formed of the same semiconductor material composition as the first vertical semiconductor patterns VS1 (e.g., they may consist of the same material or the same combination of materials). Second conductive pads PAD may be provided on top ends of the second vertical semiconductor patterns VS2. Bit lines BL may be electrically connected to the second conductive pads PAD through bit line contact plugs BPLG.

Data storage patterns DSP may be disposed between the first electrode structure ST1 and the first vertical semiconductor patterns VS1 and between the second electrode structure ST2 and the second vertical semiconductor patterns VS2.

Common source plugs CPLG may be disposed on sidewalls of the first and second electrode structures ST1 and ST2 and may be connected to the horizontal semiconductor layer 100. Insulating spacers SS formed of an insulating material may be disposed between the common source plugs CPLG and the sidewalls of the first and second electrode structures ST1 and ST2.

Referring to FIG. 6, a substrate 10 may include a cell array region CAR and a peripheral circuit region PCR. The substrate 10 may include a material having a semiconductor property (e.g., a silicon wafer), an insulating material (e.g., a glass substrate), or a semiconductor or conductor covered with an insulating material.

A peripheral logic structure may be provided on the peripheral circuit region PCR of the substrate 10. A source structure SC may be disposed on the cell array region CAR of the substrate 10, and an electrode structure ST may be provided on the source structure SC. A well dopant region 10w may be provided in the cell array region CAR of the substrate 10 (i.e., in the substrate 10 under the source structure SC). According to exemplary embodiments, the well dopant region 10w may include dopants having a first conductivity type, e.g., phosphorus (P) or arsenic (As), but the disclosure is not limited thereto. In some embodiments, the well dopant region 10w may be omitted. The well dopant region 10w may be in contact with the source structure SC.

Vertical semiconductor patterns VS may penetrate the electrode structure ST on the cell array region CAR of the substrate 10 and may be connected to the source structure SC. A data storage pattern DSP may be disposed between the electrode structure ST and each of the vertical semiconductor patterns VS.

In this exemplary embodiment, a device isolation layer 13 may be disposed in the peripheral circuit region PCR of the substrate 10 to define active regions. Peripheral gate stacks PGS may intersect the active regions, and peripheral gate insulating layers 11a and 11b may be disposed between the substrate 10 and the peripheral gate stacks PGS. Source and drain dopant regions may be provided in the active region at both sides of each of the peripheral gate stacks PGS. Each of the peripheral gate stacks PGS may include a peripheral poly-silicon pattern PCP doped with dopants (e.g., charge carrier impurities), a gate metal pattern PMP, and a peripheral hard mask pattern PHM, which are sequentially stacked on each of the peripheral gate insulating layers 11a and 11b. Spacers may cover both sidewalls of each of the peripheral gate stacks PGS.

A dummy sacrificial pattern DP may conformally cover the peripheral gate stacks PGS and the peripheral circuit region PCR of the substrate 10. For example, the dummy sacrificial pattern DP may be formed of silicon nitride.

In some embodiments, one of insulating layers ILD of the electrode structure ST may extend from the cell array region CAR onto the peripheral circuit region PCR to cover the peripheral logic structure. For example, one of the insulating layers ILD between electrodes EGE, GGE, CGE and SGE may extend to cover the dummy sacrificial pattern DP. A thick planarization insulating layer 120 may be provided on the peripheral circuit region PCR.

FIGS. 7 to 12 are cross-sectional views taken along the line I-I' of FIG. 2 to illustrate a method for manufacturing a 3D semiconductor memory device, according to some embodiments of the inventive concepts.

Figure 7:
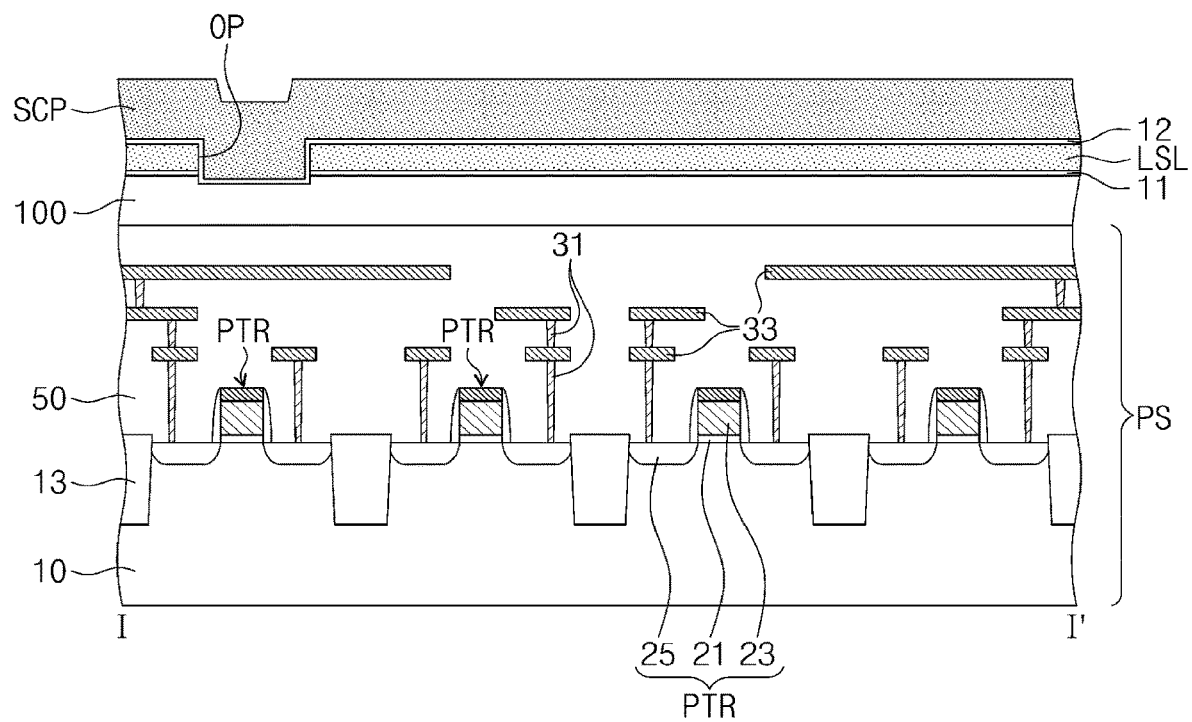
FIGS. 7 to 12 are cross-sectional views taken along the line I-I' of FIG. 2 to illustrate a method for manufacturing a 3D semiconductor memory device, according to some embodiments of the inventive concepts.

Referring to FIGS. 2 and 7, a peripheral logic structure PS may be formed on a semiconductor substrate 10. The semiconductor substrate 10 may be a bulk silicon substrate. A device isolation layer 13 may be formed in the semiconductor substrate 10 to define active regions.

The formation of the peripheral logic structure PS may include forming peripheral logic circuits PTR on the semiconductor substrate 10, forming peripheral interconnection structures 31 and 33 connected to the peripheral logic circuits PTR, and forming a lower insulating layer 50. Here, the peripheral logic circuits PTR may include MOS transistors using the semiconductor substrate 10 as channels. For example, the formation of the peripheral logic circuits PTR may include forming the device isolation layer 13 defining the active regions in the semiconductor substrate 10, forming a peripheral gate insulating layer 21 and a peripheral gate electrode 23 which are sequentially stacked on the semiconductor substrate 10, and forming source/drain regions 25 by injecting dopants into the semiconductor substrate 10 at both sides of the peripheral gate electrode 23. Peripheral gate spacers may be formed on both sidewalls of the peripheral gate electrode 23.

The lower insulating layer 50 may include one insulating layer or a plurality of stacked insulating layers, which covers the peripheral logic circuits PTR. For example, the lower insulating layer 50 may include at least one of a silicon oxide layer, a silicon nitride layer, a silicon oxynitride layer, or a low-k dielectric layer.

The formation of the peripheral interconnection structures 31 and 33 may include forming peripheral contact plugs 31 penetrating portions of the lower insulating layer 50, and forming peripheral circuit interconnection lines 33 connected to the peripheral contact plugs 31.

A horizontal semiconductor layer 100 may be formed by depositing a semiconductor material on the lower insulating layer 50. The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs) or a combination thereof. The horizontal semiconductor layer 100 may include a semiconductor material doped with charge carrier impurities (e.g., dopants of a first conductivity type (e.g., an N-type)) and/or an intrinsic semiconductor material with no doped charge carrier impurities. The horizontal semiconductor layer 100 may have a crystal structure including a single-crystalline structure, an amorphous structure, and/or a poly-crystalline structure.

A first buffer insulating layer 11 may be formed on the horizontal semiconductor layer 100, and a lower sacrificial layer LSL may be formed on the first buffer insulating layer 11. The first buffer insulating layer 11 may be formed by thermally oxidizing a surface of the horizontal semiconductor layer 100 or may be formed by depositing a silicon oxide layer.

The lower sacrificial layer LSL may have openings OP which expose portions of the first buffer insulating layer 11 or portions of the horizontal semiconductor layer 100. The openings OP may be arranged along a plurality of columns. The lower sacrificial layer LSL may be formed of a material having an etch selectivity with respect to the first buffer insulating layer 11. For example, the lower sacrificial layer LSL may be formed of at least one of a silicon nitride layer, a silicon oxynitride layer, a silicon carbide layer, or a silicon-germanium layer.

The formation of the lower sacrificial layer LSL may include depositing a lower sacrificial layer on an entire top surface of the horizontal semiconductor layer 100, forming a first mask pattern (not shown) exposing portions of the deposited lower sacrificial layer, and etching the deposited lower sacrificial layer using the first mask pattern as an etch mask to expose the first buffer insulating layer 11 or the horizontal semiconductor layer 100.

Next, a second buffer insulating layer 12 and a source conductive layer SCP may be sequentially deposited with substantially uniform thicknesses on the lower sacrificial layer LSL having the openings OP. In certain embodiments, the second buffer insulating layer 12 may be omitted and the source conductive layer SCP may be deposited directly on the lower sacrificial layer LSL. The second buffer insulating layer 12 and the source conductive layer SCP may fill the openings OP of the lower sacrificial layer LSL. When the openings OP expose the horizontal semiconductor layer 100 and the second buffer insulating layer 12 is omitted, the source conductive layer SCP may contact the horizontal semiconductor layer 100 in the openings OP. For example, the second buffer insulating layer 12 may be a silicon oxide layer, and the source conductive layer SCP may be a poly-silicon layer doped with N-type dopants and/or carbon (C).

Figure 8:
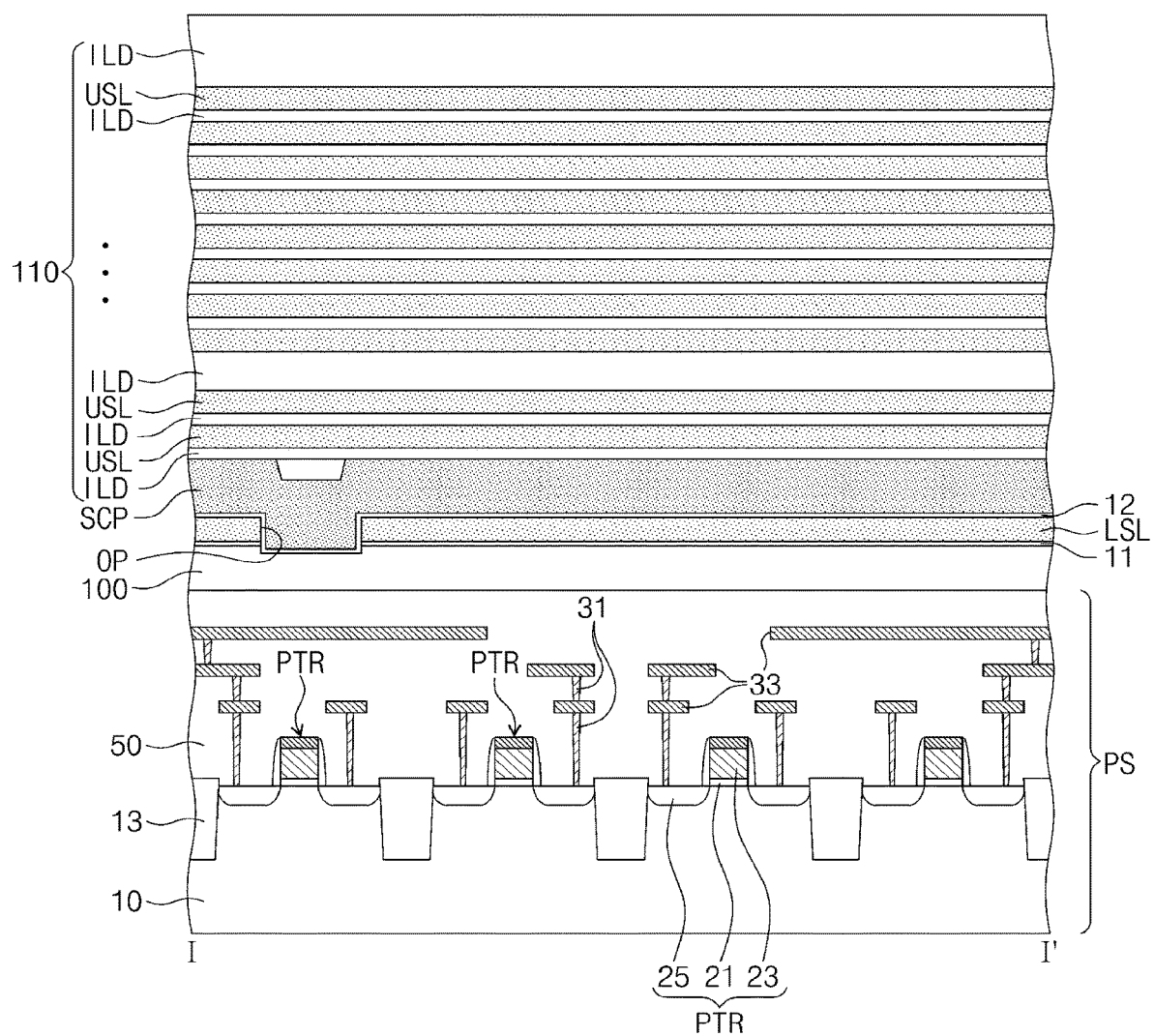

Referring to FIGS. 2 and 8, a mold structure 110 may be formed on the source conductive layer SCP. The mold structure 110 may include upper sacrificial layers USL and insulating layers ILD, which are alternately stacked in a vertical direction. In the mold structure 110, the upper sacrificial layers USL may be formed of a material having an etch selectivity with respect to the insulating layers ILD. For example, the upper sacrificial layers USL may be formed of a different insulating material from that of the insulating layers ILD. The upper sacrificial layers USL may be formed of the same material as the lower sacrificial layer LSL. For example, each of the upper sacrificial layers USL may be formed of a silicon nitride layer, and each of the insulating layers ILD may be formed of a silicon oxide layer. Thicknesses of the upper sacrificial layers USL may be substantially equal to each other, and a thickness of at least one of the insulating layers ILD may be different from that (those) of other(s) of the insulating layers ILD.

Figure 9:
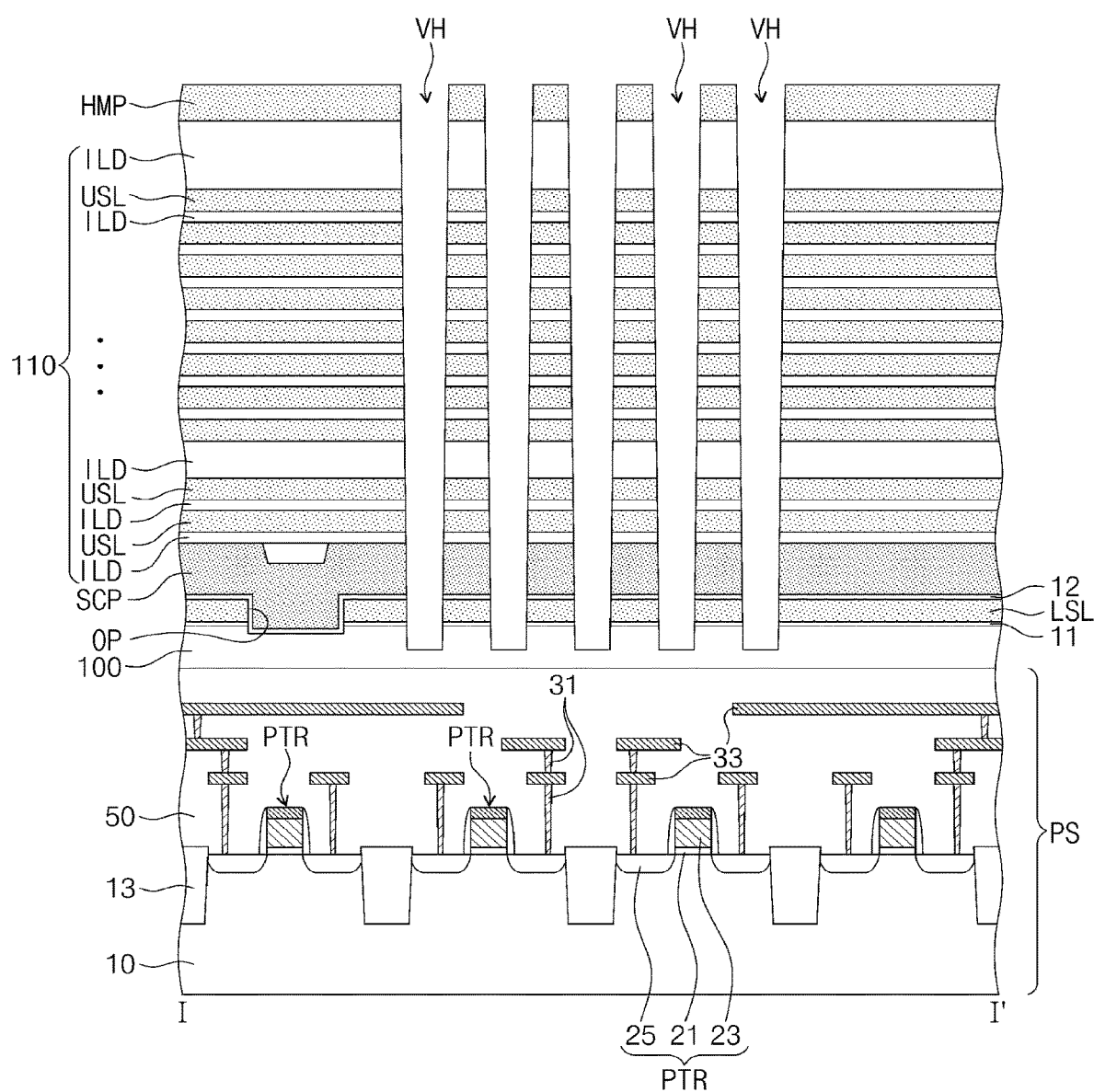

Referring to FIGS. 2 and 9, vertical holes VH may be formed to penetrate the mold structure 110. The vertical holes VH may be spaced apart from the openings OP formed in the lower sacrificial layer LSL. The vertical holes VH may be arranged in a line or in a zigzag form in one direction when viewed in a plan view.

The formation of the vertical holes VH may include forming a hard mask pattern HMP on the mold structure 110, and etching (e.g., anisotropically) the mold structure 110, the source conductive layer SCP, and the lower sacrificial layer LSL by using the hard mask pattern HMP as an etch mask. The top surface of the horizontal semiconductor layer 100 may be etched by over-etching of the anisotropic etching process for forming the vertical holes VH, and thus the top surface of the horizontal semiconductor layer 100 exposed by the vertical holes VH may be recessed by a predetermined depth. For example, vertical distances between the top surface of the horizontal semiconductor layer 100 and bottom surfaces of the vertical holes VH may be greater than a vertical thickness of the lower sacrificial layer LSL. In addition, widths of lower portions of the vertical holes VH may be less than widths of upper portions of the vertical holes VH.

Figure 10:
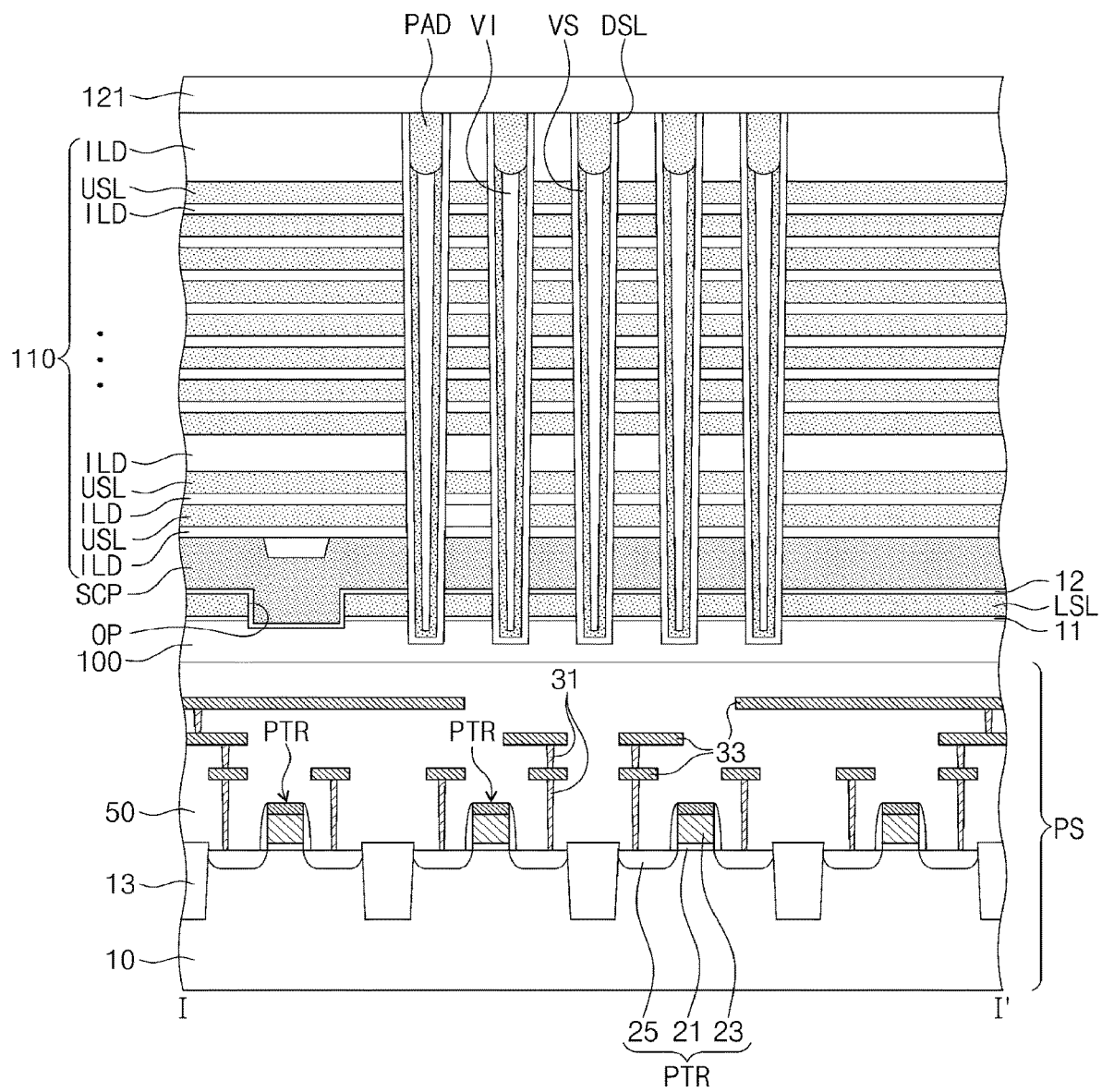

Referring to FIGS. 2 and 10, vertical structures may be formed in the vertical holes VH, respectively. The formation of the vertical structures may include forming a data storage layer DSL and a vertical semiconductor pattern VS which are sequentially stacked in each of the vertical holes VH. A sum of thicknesses of the data storage layer DSL and the vertical semiconductor pattern VS on an inner sidewall of the vertical hole in a direction parallel to the top surface of the horizontal semiconductor layer 100 may be less than about a half of a top width of the vertical hole in the direction parallel to the top surface of the horizontal semiconductor layer 100. For example, the data storage layer DSL and the vertical semiconductor pattern VS may define an empty space in each of the vertical holes, and the empty space may be filled with an insulating material VI.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The data storage layer DSL may have a substantially uniform thickness and may conformally cover the inner sidewall of the vertical hole. The data storage layer DSL may include a tunnel insulating layer, a charge storage layer and a blocking insulating layer, which are sequentially stacked. A vertical semiconductor layer may be deposited with a substantially uniform thickness on the data storage layer DSL by a chemical vapor deposition (CVD) method or an atomic layer deposition (ALD) method, and a planarization process may be performed on the vertical semiconductor layer to form the vertical semiconductor pattern VS. The vertical semiconductor pattern VS may include a semiconductor material doped with dopants (e.g., charge carrier impurities) or an intrinsic semiconductor material not doped with dopants.

Subsequently, a bit line conductive pad PAD may be formed on a top end of each of the vertical semiconductor patterns VS. The bit line conductive pad PAD may be a dopant region doped with dopants or may be formed of a conductive material. A bottom surface of the bit line conductive pad PAD may be located at a higher level than a top surface of an uppermost one of the upper sacrificial layers USL. After the formation of the bit line conductive pads PAD, a first interlayer insulating layer 121 may be formed on the mold structure 110 to cover the bit line conductive pads PAD.

Figure 11:
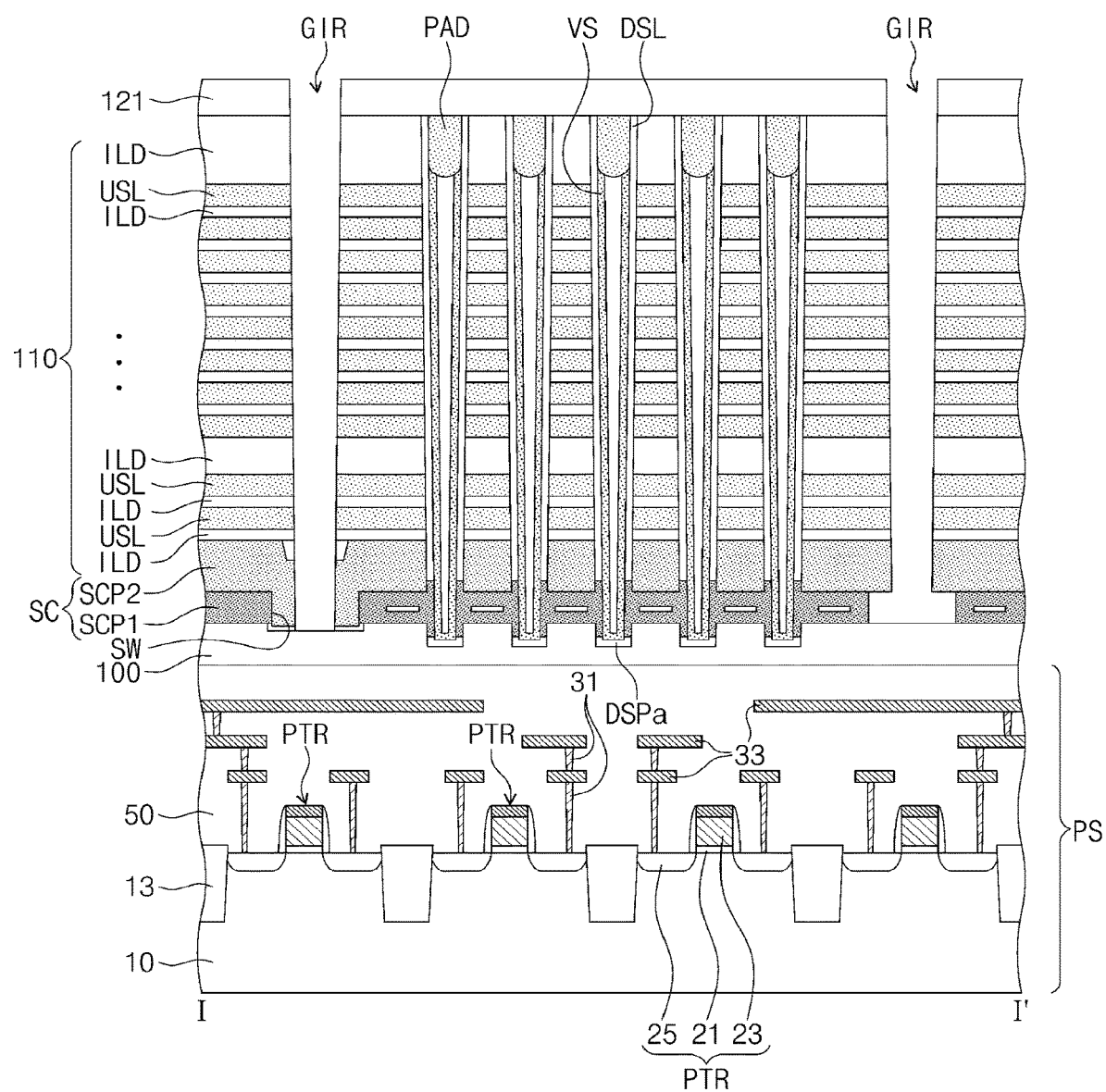

Referring to FIGS. 2 and 11, a source structure SC may be formed between the horizontal semiconductor layer 100 and the mold structure 110. A process of forming the source structure SC may include a process of replacing the lower sacrificial layer LSL with a first source conductive pattern SCP1. The first source conductive pattern SCP1 may be formed to contact portions of sidewalls of the vertical semiconductor patterns VS, as described above. A portion of the first buffer insulating layer 11 under the lower sacrificial layer LSL may be removed when the first source conductive pattern SCP1 is formed, and thus the first source conductive pattern SCP1 may be in contact with the horizontal semiconductor layer 100. According to alternative exemplary embodiments, the first buffer insulating layer 11 may remain on the horizontal semiconductor layer 100 after the formation of the first source conductive pattern SCP1. In addition, the process of forming the source structure SC may include a process of forming gate isolation regions GIR. The gate isolation regions GIR may have line shapes extending in the first direction D1 and may expose the top surface of the horizontal semiconductor layer 100. In addition, the gate isolation regions GIR may penetrate portions of a second source conductive pattern SCP2 (i.e., the source conductive layer SCP), which fill the openings OP.

The method of forming the source structure SC according to some embodiments of the inventive concepts will be described later in more detail with reference to FIGS. 13A to 21A and 13B to 21B.

Figure 12:
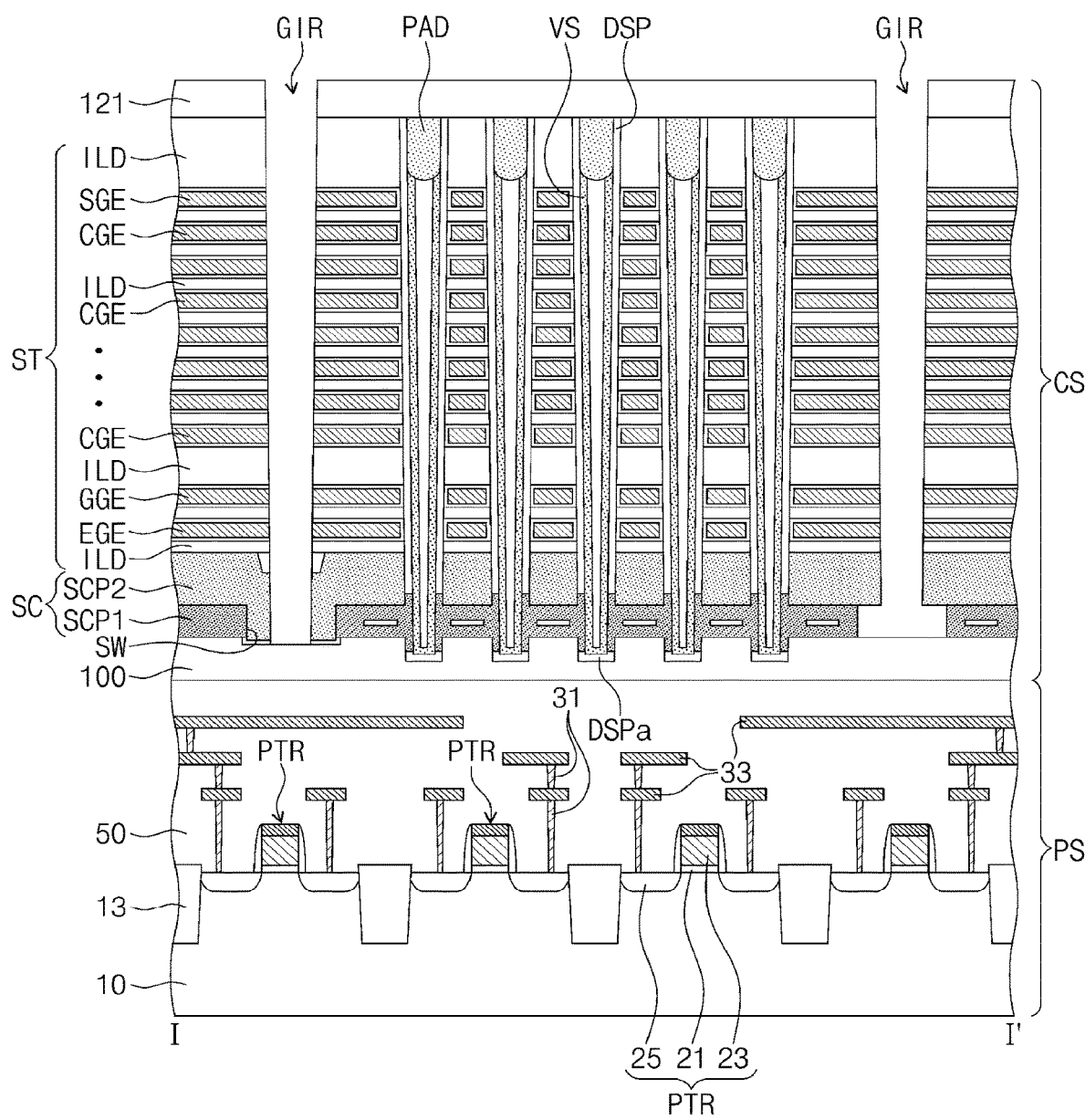

Referring to FIGS. 2 and 12, after the formation of the source structure SC, a process of replacing the upper sacrificial layers USL with electrodes EGE, GGE, CGE and SGE may be performed to form the electrode structure ST described above. The method of forming the electrode structure ST will be described later in more detail with reference to FIGS. 20A, 20B, 21A and 21B.

Referring again to FIGS. 2 and 3, after the formation of the electrode structure ST, insulating spacers SS and common source plugs CPLG may be formed in the gate isolation regions GIR. In some embodiments, the formation of the insulating spacers SS may include depositing a spacer layer with a uniform thickness on the horizontal semiconductor layer 100 on which the electrode structure ST is formed, and performing an etch-back process on the spacer layer to expose the first source conductive pattern SCP1 or the horizontal semiconductor layer 100. Subsequently, a conductive layer may be deposited to fill the gate isolation regions GIR having the insulating spacers SS, and the deposited conductive layer may be planarized until a top surface of the first interlayer insulating layer 121 is exposed, thereby forming the common source plugs CPLG. The common source plugs CPLG may be connected to the horizontal semiconductor layer 100 or the first source conductive pattern SCP1.

Thereafter, a second interlayer insulating layer 123 may be formed on the first interlayer insulating layer 121 to cover top surfaces of the common source plugs CPLG. Bit line contact plugs BPLG may be formed to penetrate the second and first interlayer insulating layers 123 and 121. The bit line contact plugs BPLG may be connected to the bit line conductive pads PAD. The bit lines BL described above may be formed on the second interlayer insulating layer 123.

FIGS. 13A to 21A are cross-sectional views illustrating a method of forming a source structure of a 3D semiconductor memory device according to some embodiments of the inventive concepts. FIGS. 13B to 21B are enlarged views of portions 'A' of FIGS. 13A to 21A, respectively. FIGS. 18C, 18D, 19C and 21C are enlarged views of the portions 'A' of FIGS. 18A, 19A and 21A.

Figure 13A:
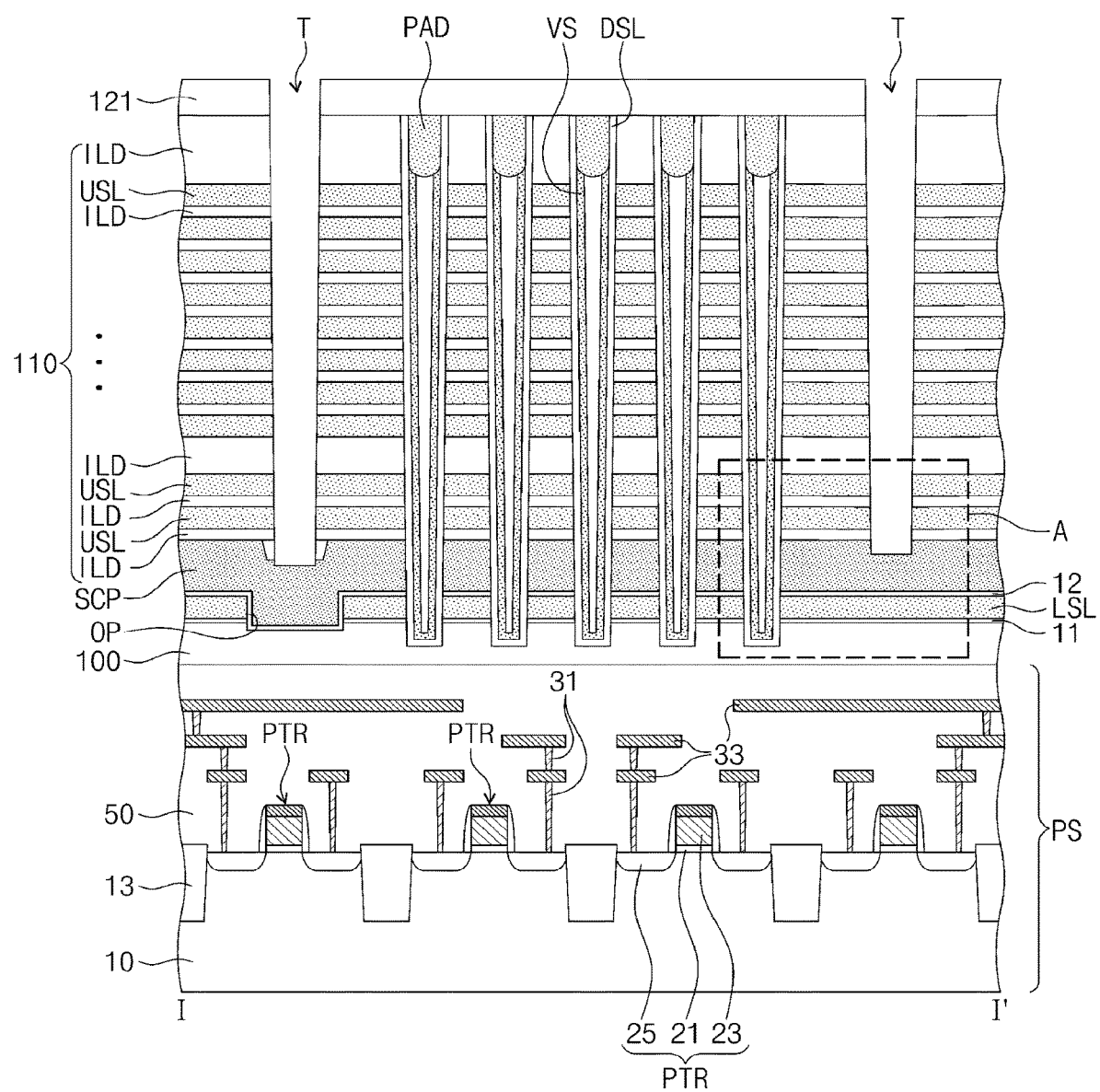

Referring to FIGS. 2, 13A and 13B, the vertical semiconductor patterns VS may be formed as described with reference to FIG. 10, and then, trenches T may be formed to penetrate the mold structure 110. The trenches T may be spaced apart from the vertical semiconductor patterns VS. The trenches T may have line shapes extending in the first direction D1 and may be spaced apart from each other in the second direction D2.

The formation of the trenches T may include forming the first interlayer insulating layer 121 covering the vertical semiconductor patterns VS, forming a mask pattern (not shown) defining planar positions of the trenches T on the first interlayer insulating layer 121, and anisotropically etching the mold structure 110 using the mask pattern as an etch mask. Sidewalls of the upper sacrificial layers USL and sidewalls of the insulating layers ILD may be exposed by the trenches T. The source conductive layer SCP may be used as an etch stop layer in the anisotropic etching process for forming the trenches T, and the trenches T may expose portions of the source conductive layer SCP.

Figure 14A:
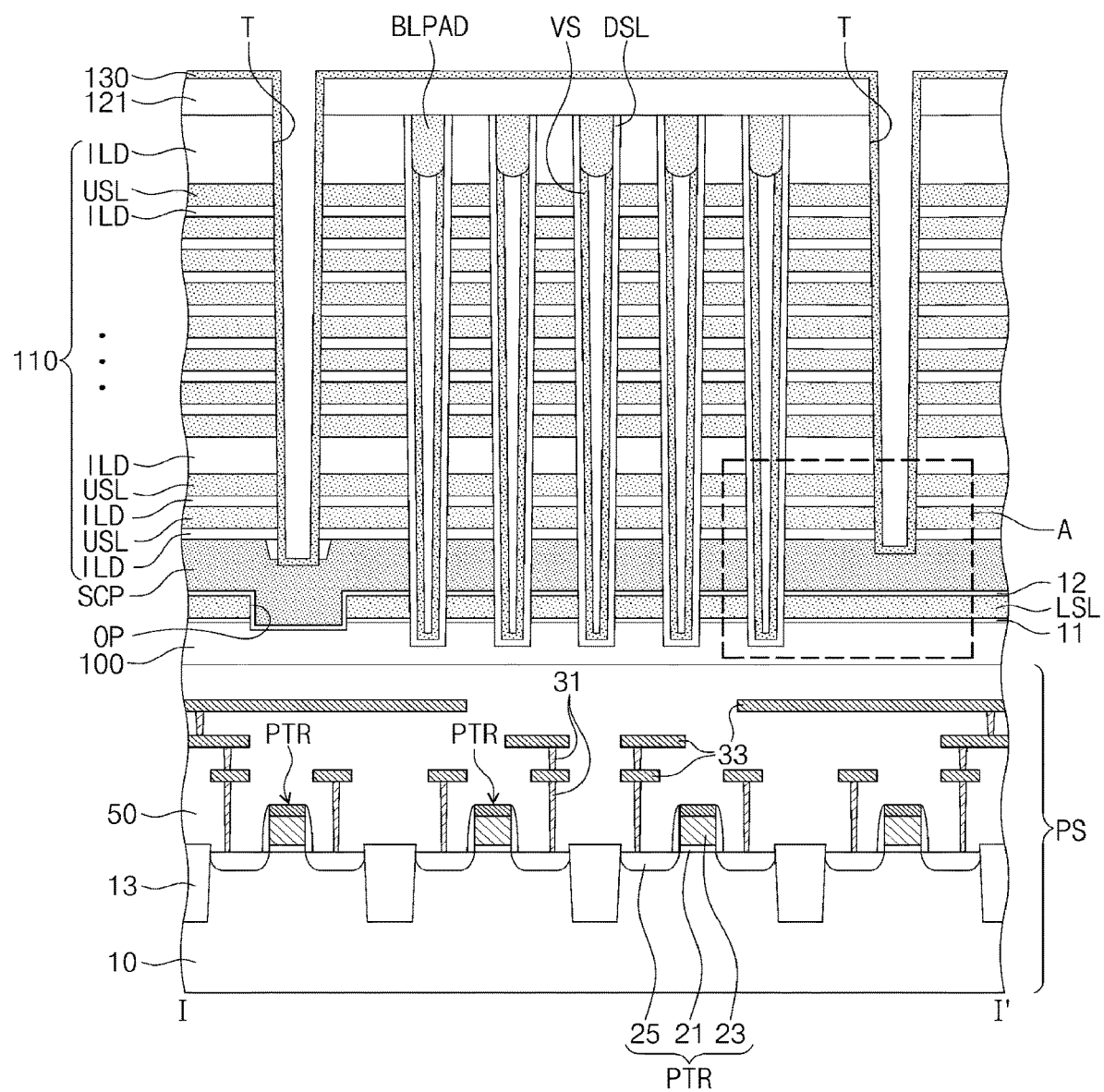
Figure 14B:
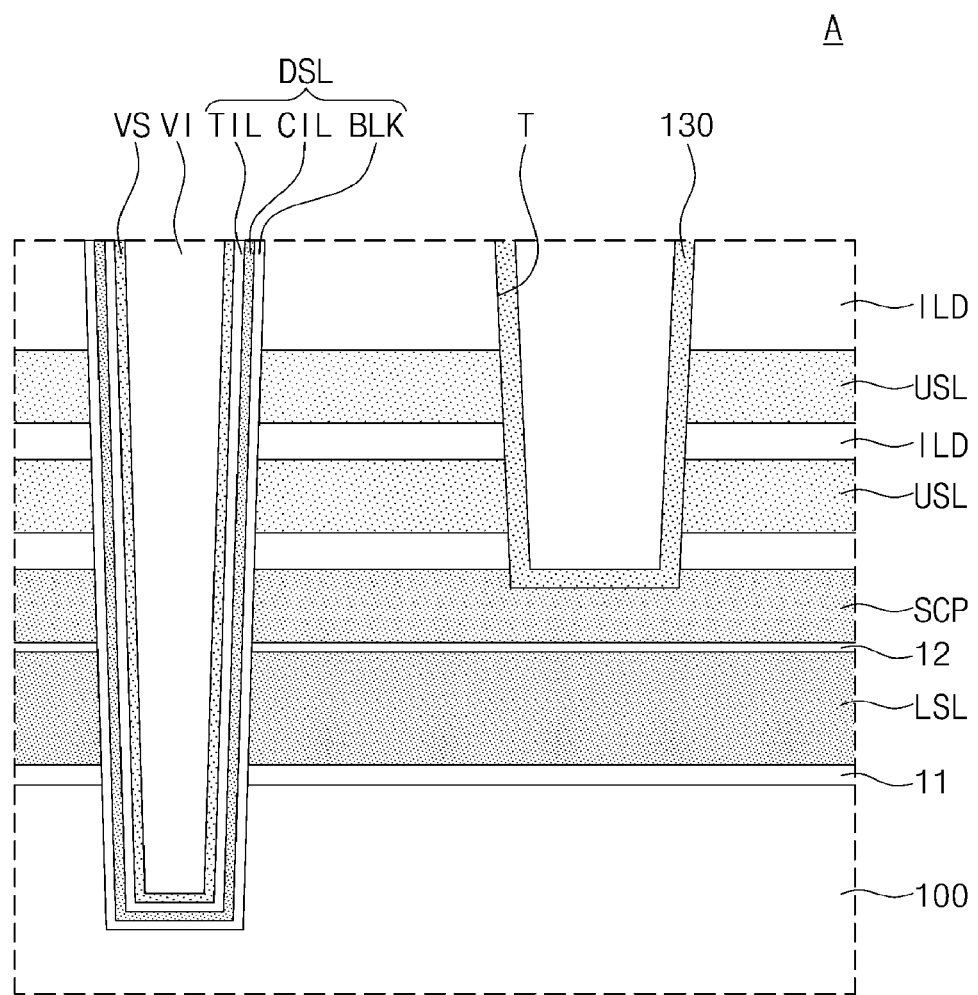

Referring to FIGS. 2, 14A and 14B, a sacrificial spacer layer 130 may be formed on inner surfaces of the trenches T. The sacrificial spacer layer 130 may conformally cover sidewalls and bottom surfaces of the trenches T. For example, the sacrificial spacer layer 130 may cover the sidewalls of the upper sacrificial layers USL, the sidewalls of the insulating layers ILD, and the top surface of the source conductive layer SCP, which are exposed by the trenches T. The sacrificial spacer layer 130 may be formed of a material having an etch selectivity with respect to the mold structure 110 and the lower sacrificial layer LSL. For example, the sacrificial spacer layer 130 may be formed of a poly-silicon layer. A thickness of the sacrificial spacer layer 130 may be less than about a half of a width of the trench T, and the sacrificial spacer layer 130 may be deposited with a substantially uniform thickness by a deposition process.

Figure 15A:
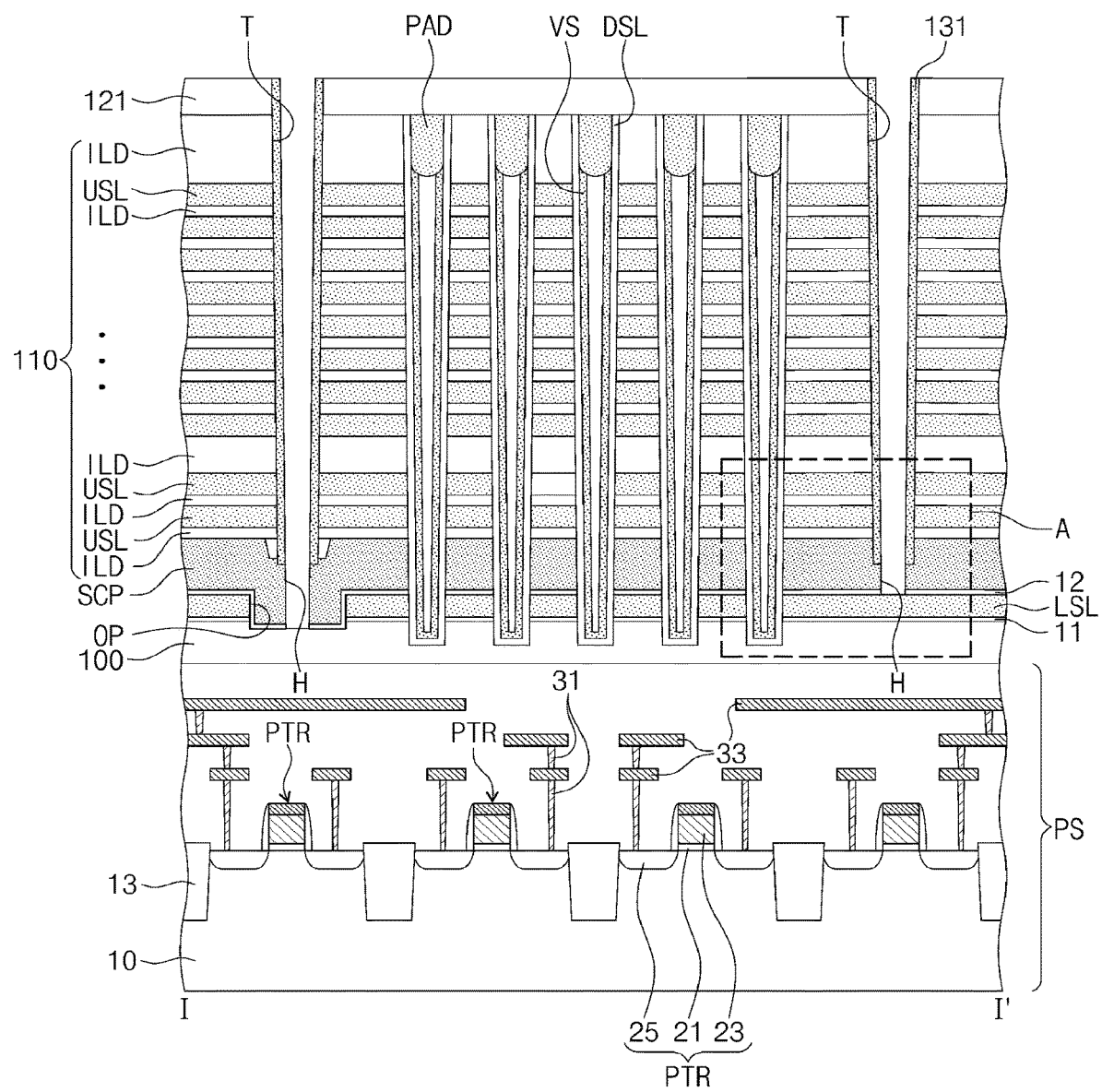
Figure 15B:
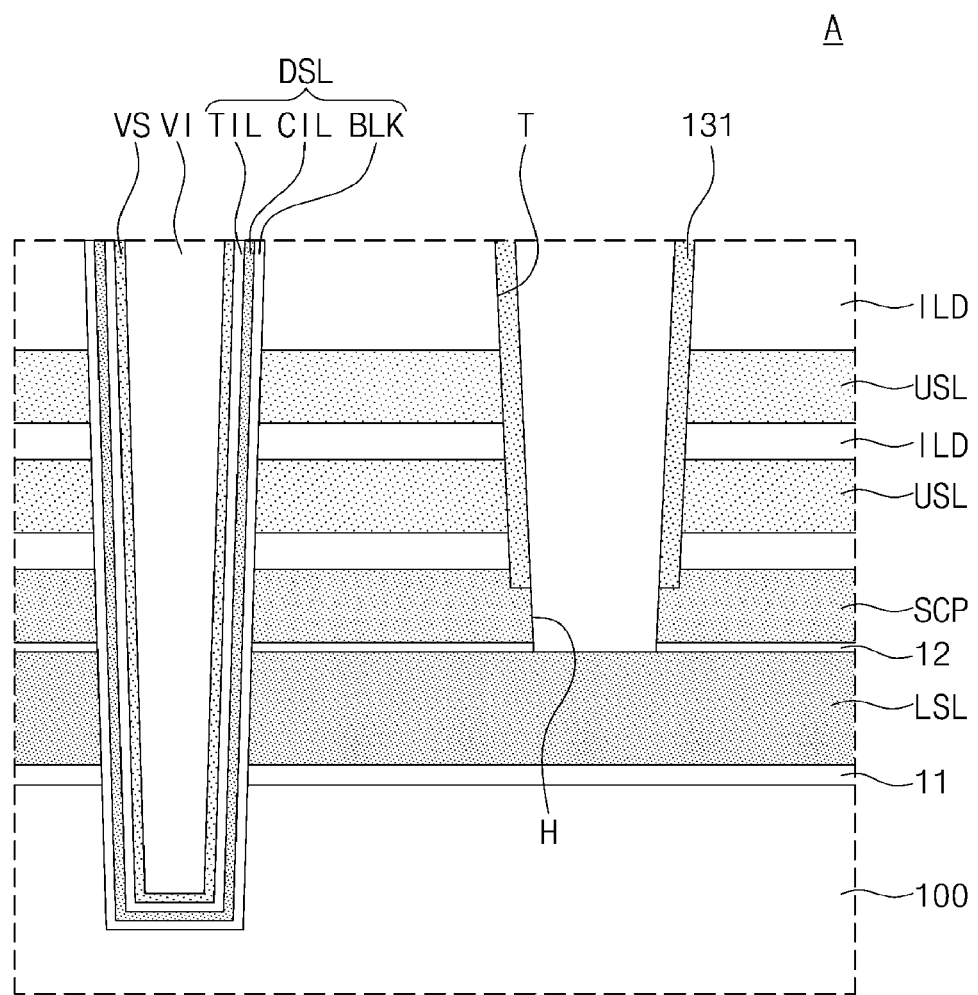

Referring to FIGS. 2, 15A and 15B, an anisotropic etching process may be performed on the sacrificial spacer layer 130 to form sacrificial spacers 131 covering the sidewalls of the trenches T (i.e., sidewalls of the mold structure 110). The source conductive layer SCP under the trenches T may be etched during the anisotropic etching process for forming the sacrificial spacers 131. Thus, through-holes H may be formed under the trenches T. The through-holes H may penetrate the source conductive layer SCP to expose the lower sacrificial layer LSL. The through-hole H overlapping with the opening OP of the lower sacrificial layer LSL may expose a portion of the horizontal semiconductor layer 100 under the opening OP.

Figure 16A:
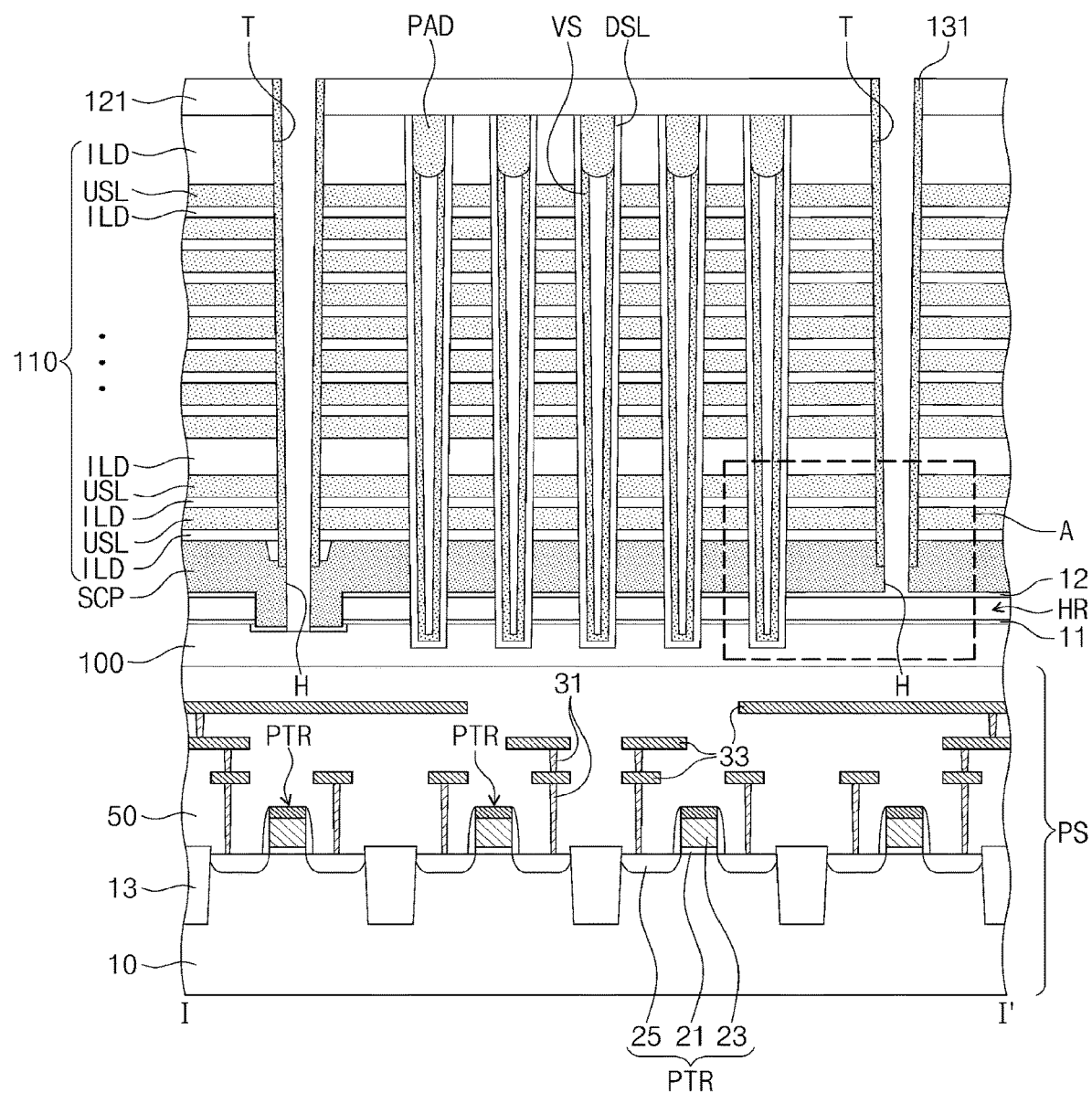
Figure 16B:
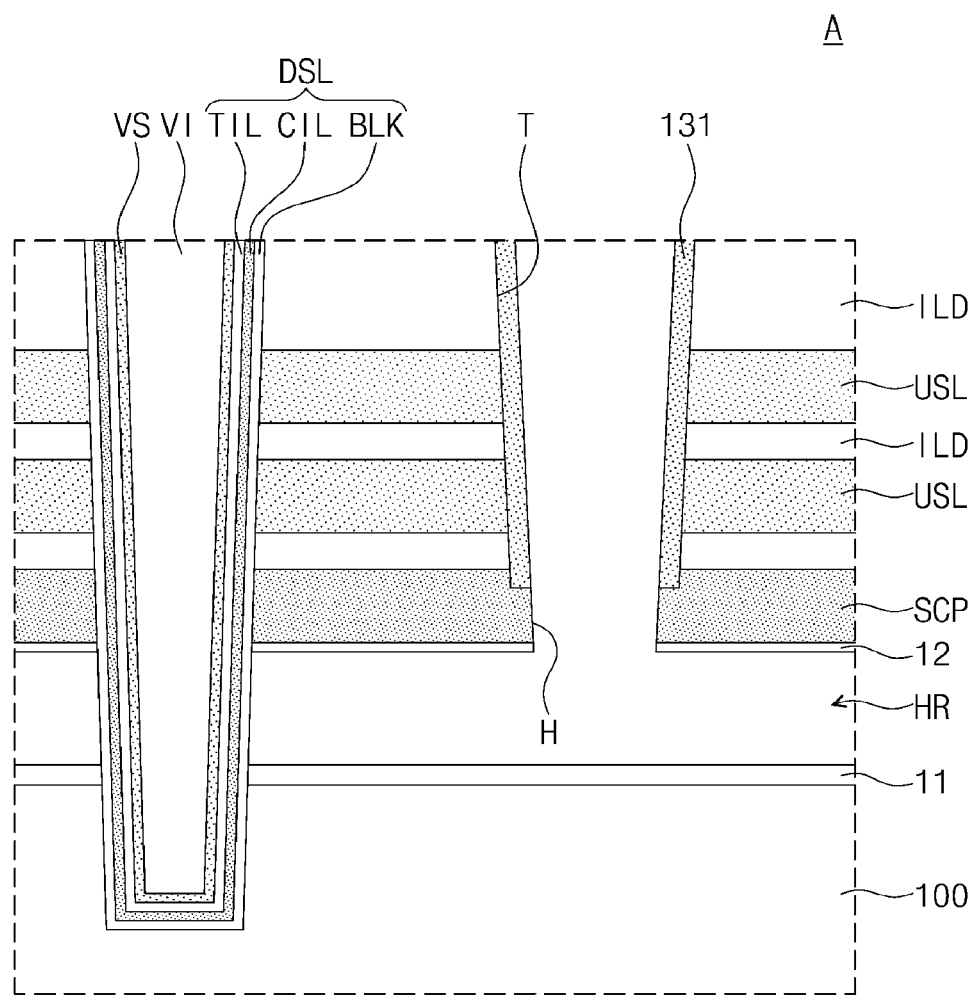

Referring to FIGS. 2, 16A and 16B, an isotropic etching process may be performed on the lower sacrificial layer LSL exposed by the through-hole H to form a horizontal recess region HR exposing portions of the data storage layers DSL. In the isotropic etching process, the horizontal recess region HR may be formed using an etch recipe having an etch selectivity with respect to the sacrificial spacers 131, the first and second buffer insulating layers 11 and 12 and the data storage layer DSL. When the lower sacrificial layer LSL includes a silicon nitride layer or a silicon oxynitride layer, the isotropic etching process performed on the lower sacrificial layer LSL may use an etching solution including phosphoric acid.

The horizontal recess region HR may laterally extend from the through-hole H into between the source conductive layer SCP and the horizontal semiconductor layer 100. For example, the horizontal recess region HR may be an empty space between the source conductive layer SCP and the horizontal semiconductor layer 100. The horizontal recess region HR may expose the portions of the data storage layers DSL between the source conductive layer SCP and the horizontal semiconductor layer 100. When the horizontal recess region HR is formed, the portions of the source conductive layer SCP, which fill the openings OP of the lower sacrificial layer LSL, may function as supporters preventing the mold structure 110 from collapsing.

Figure 17A:
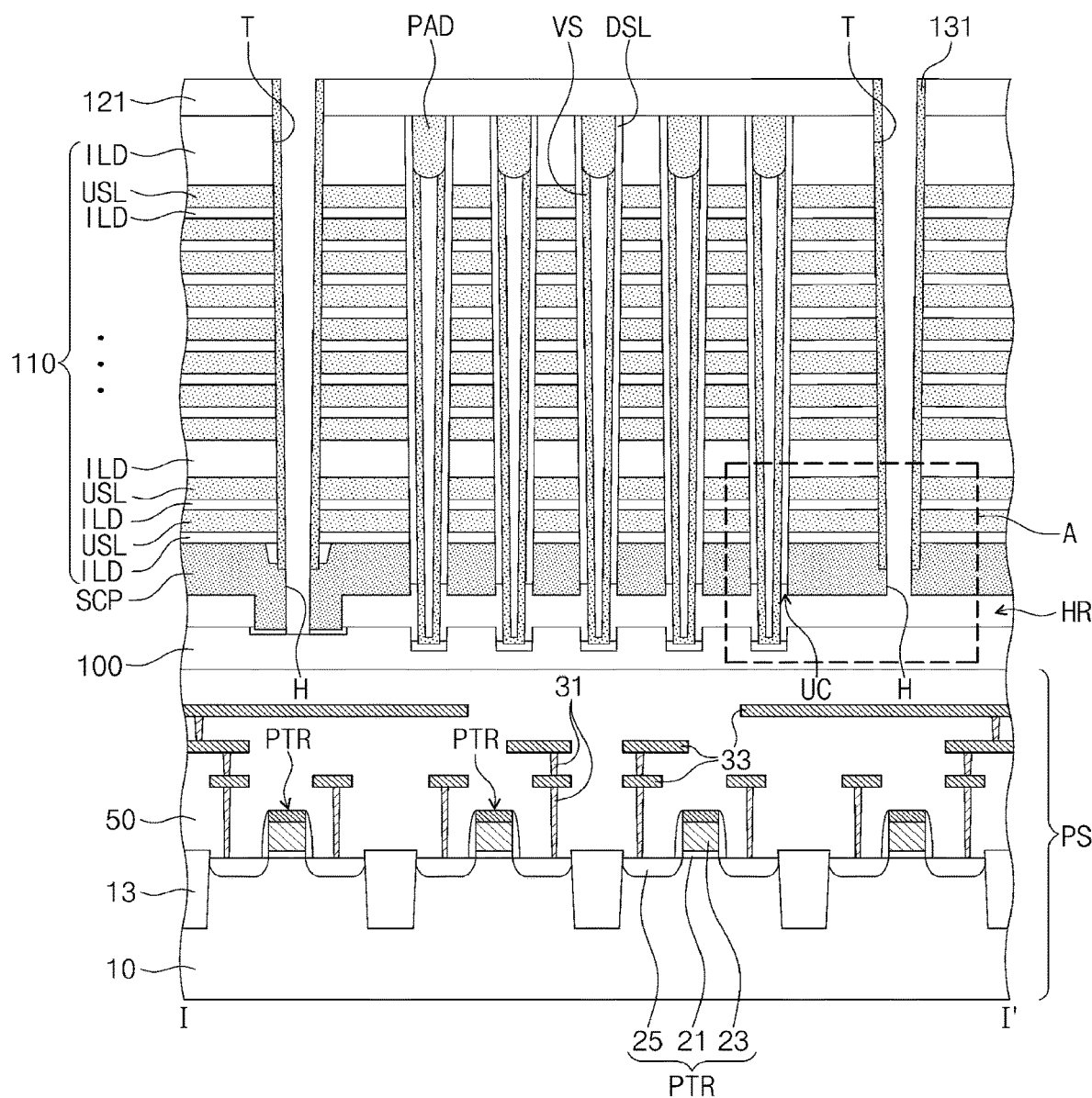
Figure 17B:
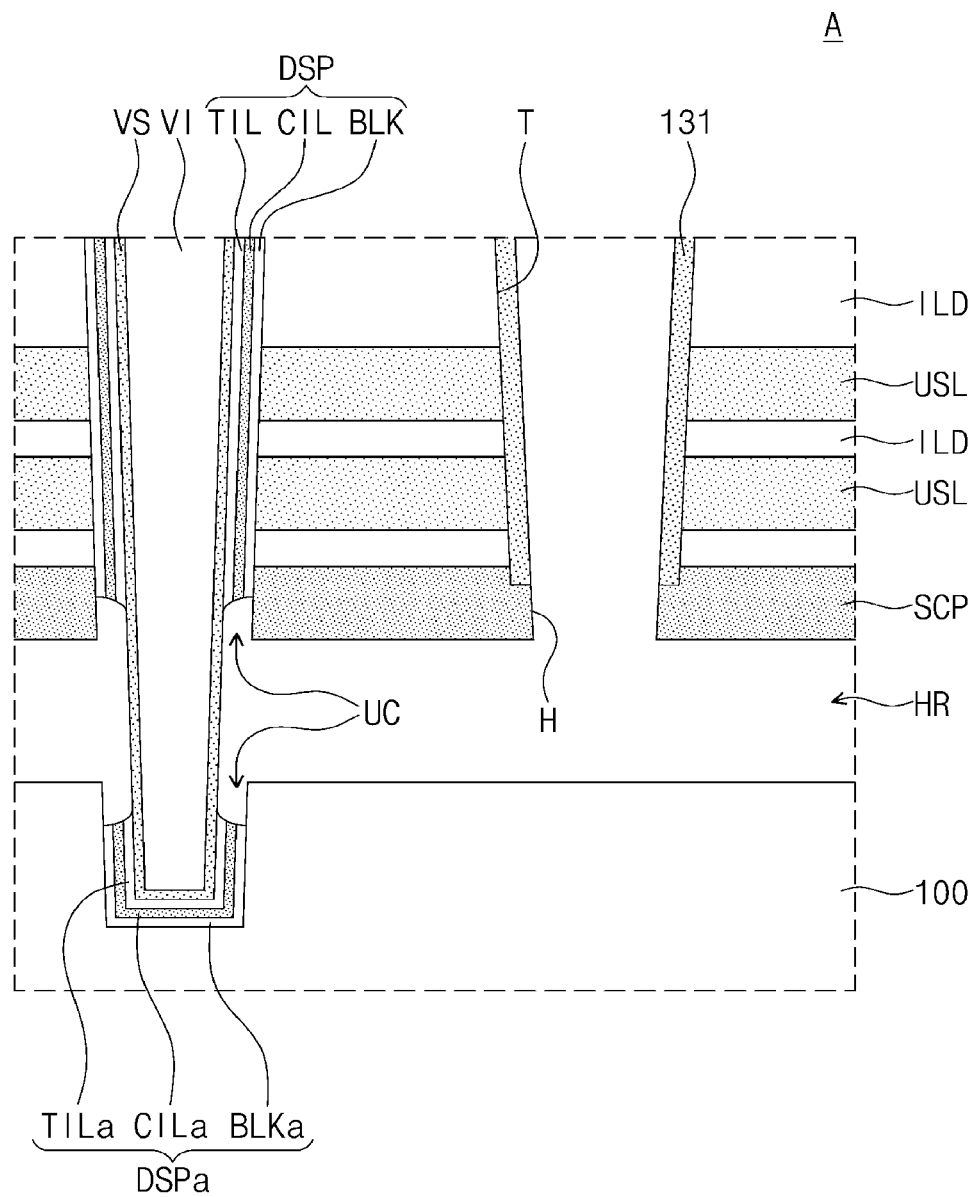

Referring to FIGS. 2, 17A and 17B, the portions of the data storage layers DSL exposed by the horizontal recess region HR may be isotropically etched to form undercut regions UC exposing portions of the vertical semiconductor patterns VS. The undercut region UC may be an empty space vertically extending from the horizontal recess region HR and may be defined between the vertical semiconductor pattern VS and a sidewall of the source conductive layer SCP.

Since the isotropic etching process is performed on the data storage layer DSL surrounding each of the vertical semiconductor patterns VS, the data storage layer DSL may be divided into a data storage pattern DSP and a dummy data storage pattern DSPa, which are vertically spaced apart from each other. The isotropic etching process performed on the data storage layer DSL may use an etch recipe having an etch selectivity with respect to the horizontal semiconductor layer 100, the source conductive layer SCP, the vertical semiconductor pattern VS, and the sacrificial spacer 131.

The isotropic etching of the data storage layer DSL may include sequentially and isotropically etching the blocking insulating layer BLK, the charge storage layer CIL and the tunnel insulating layer TIL, which are exposed by the horizontal recess region HR. In more detail, the isotropic etching process for forming the undercut region UC may include a first etching process for etching a portion of the blocking insulating layer BLK, a second etching process for etching a portion of the charge storage layer CIL, and a third etching process for etching a portion of the tunnel insulating layer TIL. The first, second and third etching processes may be sequentially performed. Here, the first and third etching processes may use an etching solution including hydrofluoric acid or sulfuric acid, and the second etching process may use an etching solution including phosphoric acid.

A bottom surface of the data storage pattern DSP and a top surface of the dummy data storage pattern DSPa may be defined by the formation of the undercut region UC. The bottom surface of the data storage pattern DSP and the top surface of the dummy data storage pattern DSPa may have tapered shapes. In addition, a level of the bottom surface of the data storage pattern DSP and a level of the top surface of the dummy data storage pattern DSPa may be changed by the isotropic etching process of the data storage layer DSL. Since the first, second and third etching processes are performed on the data storage layer DSL to form the undercut region UC, the bottom surface of the data storage pattern DSP and the top surface of the dummy data storage pattern DSPa may have curved or bent surfaces.

In addition, during the isotropic etching process of the data storage layer DSL, the first and second buffer insulating layers 11 and 12 exposed by the horizontal recess region HR may be etched to expose the bottom surface of the source conductive layer SCP and the top surface of the horizontal semiconductor layer 100 through the horizontal recess region HR.

After the formation of the undercut region UC, a height of the horizontal recess region HR (i.e., a distance between the top surface of the horizontal semiconductor layer 100 and a bottom surface of the source conductive layer SCP) may be less than a width of the through-hole H.

Referring to FIGS. 2, 18A, 18B, 18C and 18D, a sidewall contact layer SCL may be formed in the undercut regions UC, the horizontal recess region HR, the through-holes H, and the trenches T. The sidewall contact layer SCL may be formed using a chemical vapor deposition (CVD) process or an atomic layer deposition (ALD) process. The sidewall contact layer SCL may be a semiconductor layer doped with dopants, for example, N-type dopants.

The sidewall contact layer SCL may cover inner surfaces of the undercut region UC, the horizontal recess region HR and the through-hole H. The sidewall contact layer SCL may not completely fill the through-hole H and may define a gap region G. The sidewall contact layer SCL may contact portions of the vertical semiconductor patterns VS under the source conductive layer SCP.

In more detail, a semiconductor source gas may be supplied into the undercut region UC, the horizontal recess region HR, and the through-hole H in the deposition process for forming the sidewall contact layer SCL, and thus a semiconductor material may be deposited from the inner surfaces of the undercut region UC, the horizontal recess region HR and the through-hole H.

When the sidewall contact layer SCL is formed, the semiconductor material may be vertically deposited from the top surface of the horizontal semiconductor layer 100 and the bottom surface of the source conductive layer SCP, and thus a discontinuous interface S and/or the air gap AG may be formed at a level between the top surface of the horizontal semiconductor layer 100 and the bottom surface of the source conductive layer SCP. The discontinuous interface S or the air gap AG may be horizontally spaced apart from the through-hole H. In addition, when the sidewall contact layer SCL is formed, the semiconductor material may be deposited from the sidewall of the vertical semiconductor pattern VS exposed through the undercut region UC and the sidewall of the through-hole H in a horizontal direction, and thus the discontinuous interface S and/or the air gap AG may be horizontally spaced apart from the vertical semiconductor pattern VS.

Figure 18A:
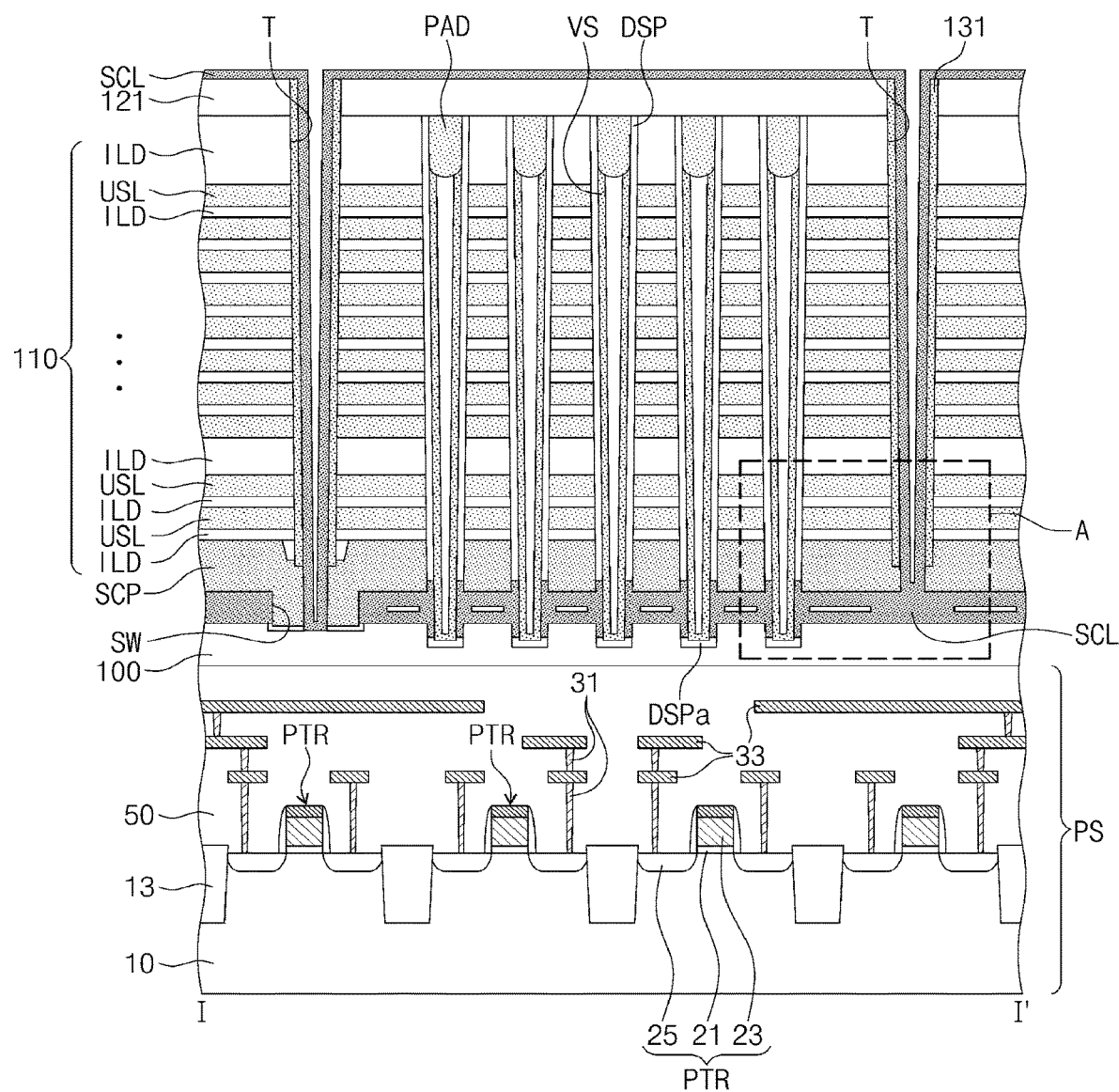
Figure 18B:
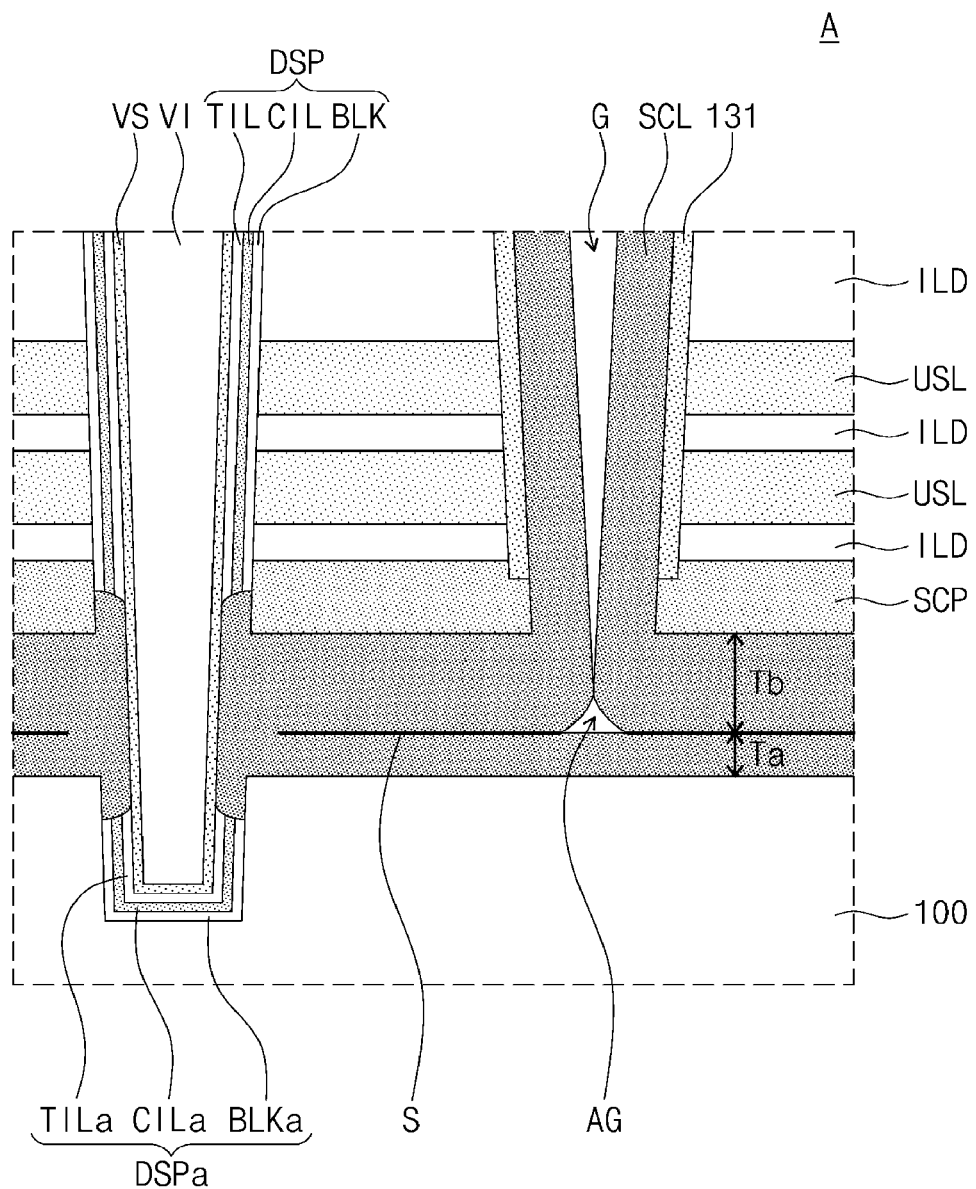

In some embodiments, when the sidewall contact layer SCL is formed, the semiconductor material may be deposited from the top surface of the horizontal semiconductor layer 100, the bottom surface of the source conductive layer SCP, and the sidewall of the through-hole H, and thus the sidewall contact layer SCL may define an air gap AG at a position in the horizontal recess region HR which overlaps with a center of the through-hole H, as illustrated in FIG. 18B.

When the sidewall contact layer SCL is formed, a deposition rate of the semiconductor material may be changed depending on characteristics of a surface exposed by the horizontal recess region HR. For example, a deposition rate of the semiconductor material on the top surface of the horizontal semiconductor layer 100 may be different from a deposition rate of the semiconductor material on the bottom surface of the source conductive layer SCP. In addition, when the sidewall contact layer SCL is formed, a crystal structure of the semiconductor material may be determined depending on a crystal structure of the surface exposed by the horizontal recess region HR. In some embodiments, as illustrated in FIG. 18B, a thickness Ta of the semiconductor material deposited on the top surface of the horizontal semiconductor layer 100 may be less than a thickness Tb of the semiconductor material deposited on the bottom surface of the source conductive layer SCP. According to alternative exemplary embodiments, a thickness of the semiconductor material deposited on the top surface of the horizontal semiconductor layer 100 may be substantially equal to a thickness of the semiconductor material deposited on the bottom surface of the source conductive layer SCP. The sidewall contact layer SCL deposited on a sidewall of the sacrificial spacer 131 may be thicker than the sacrificial spacer 131.

Figure 18C:
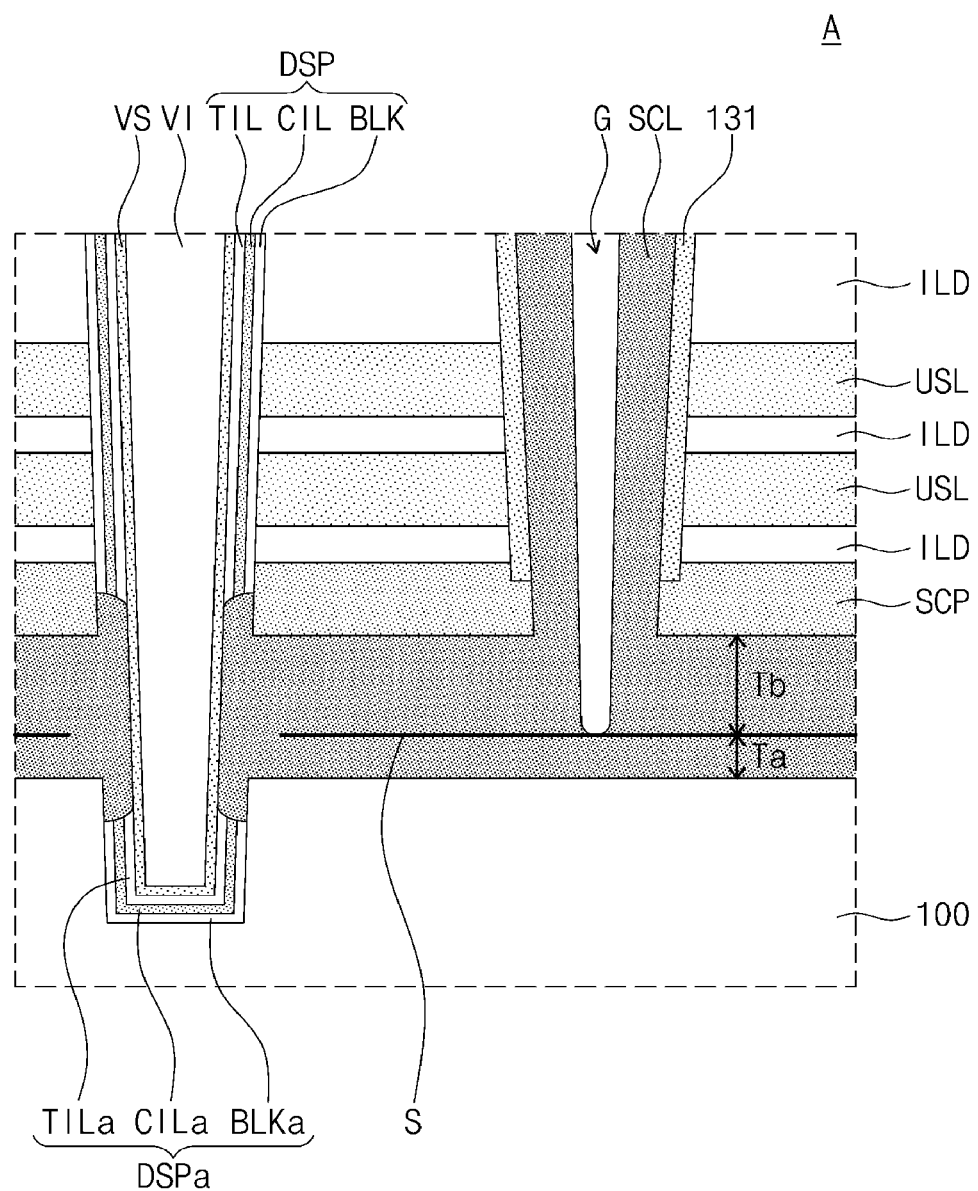
FIGS. 18C, 18D, 19C and 21C are enlarged views of the portions 'A' of FIGS. 18A, 19A and 21A.
Figure 18D:
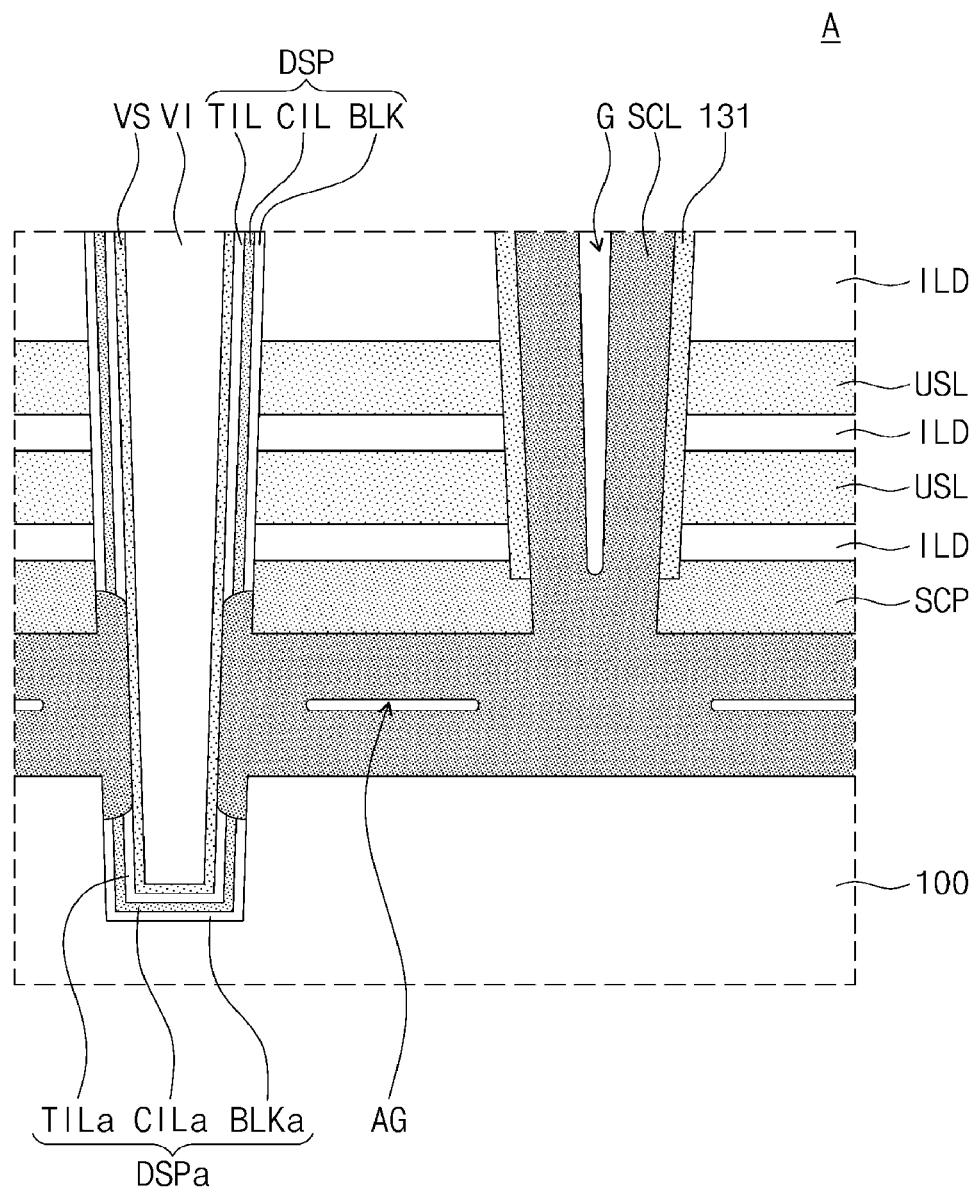

In some embodiments, when the horizontal semiconductor layer 100 is a single-crystalline silicon layer and the source conductive layer SCP is a poly-crystalline silicon layer, the discontinuous interface S or the air gap AG formed by the sidewall contact layer SCL may be closer to the top surface of the horizontal semiconductor layer 100 than to the bottom surface of the source conductive layer SCP, as illustrated in FIGS. 18B and 18C. In addition, single-crystalline silicon may be deposited on the top surface of the horizontal semiconductor layer 100, and amorphous silicon may be deposited on the bottom surface of the source conductive layer SCP. According to alternative exemplary embodiments, amorphous silicon or poly-crystalline silicon may be deposited on the top surface of the horizontal semiconductor layer 100 and the bottom surface of the source conductive layer SCP. In certain embodiments, when both the horizontal semiconductor layer 100 and the source conductive layer SCP are formed of poly-crystalline silicon, the discontinuous interface S (e.g., a seam) or the air gap AG (e.g., a void) may be formed at substantially equal distances from the top surface of the horizontal semiconductor layer 100 and the bottom surface of the source conductive layer SCP.

Referring to FIG. 18C, a bottom end of the gap region G defined by the sidewall contact layer SCL may be lower than the bottom surface of the source conductive layer SCP. According to alternative exemplary embodiments, referring to FIG. 18D, the sidewall contact layer SCL may be deposited to fill a lower portion of the through-hole H. For example, a bottom end of the gap region G defined in the through-hole H by the sidewall contact layer SCL may be located at a higher level than the bottom surface of the source conductive layer SCP.

Figure 19A:
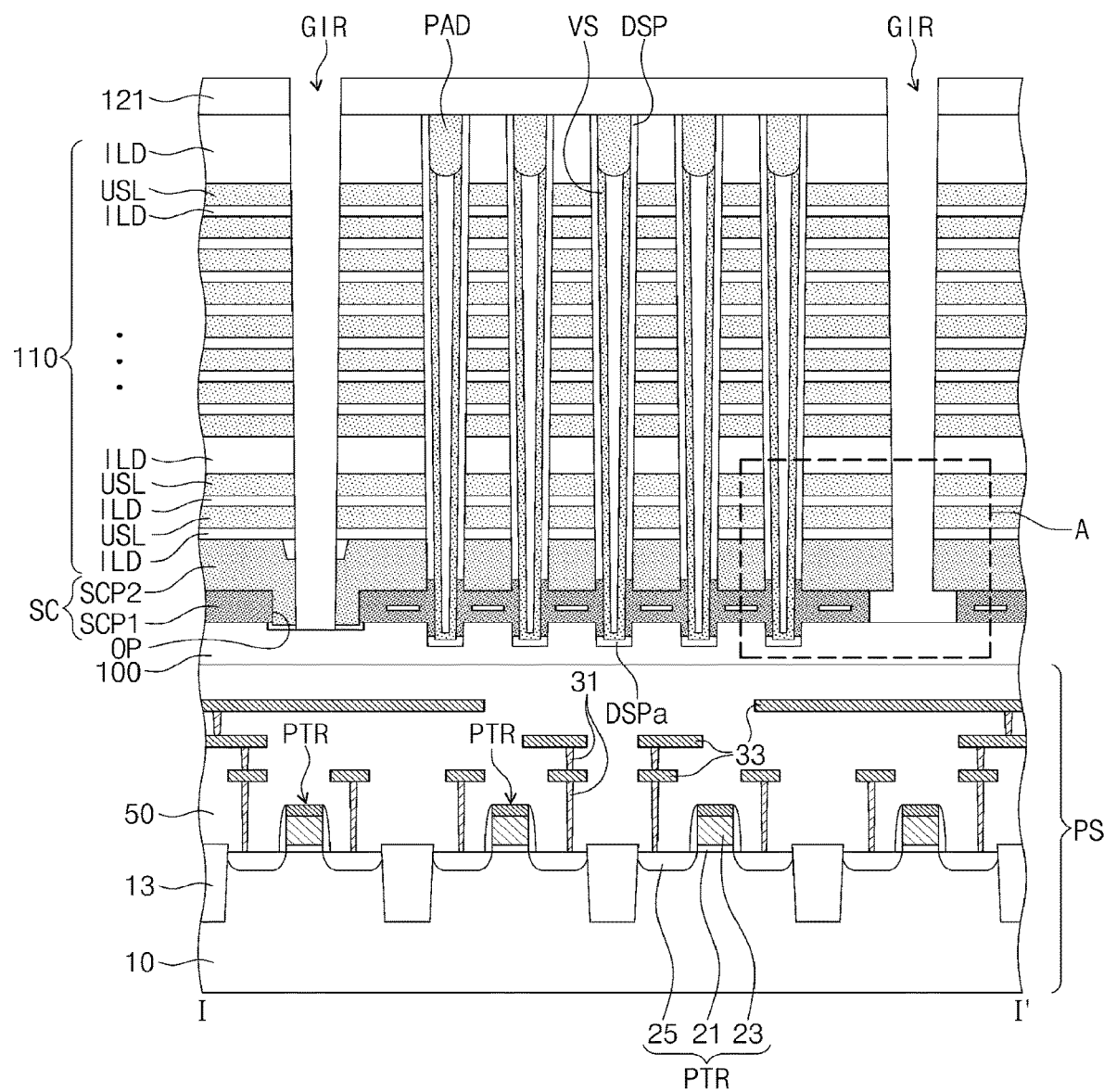
Figure 19B:
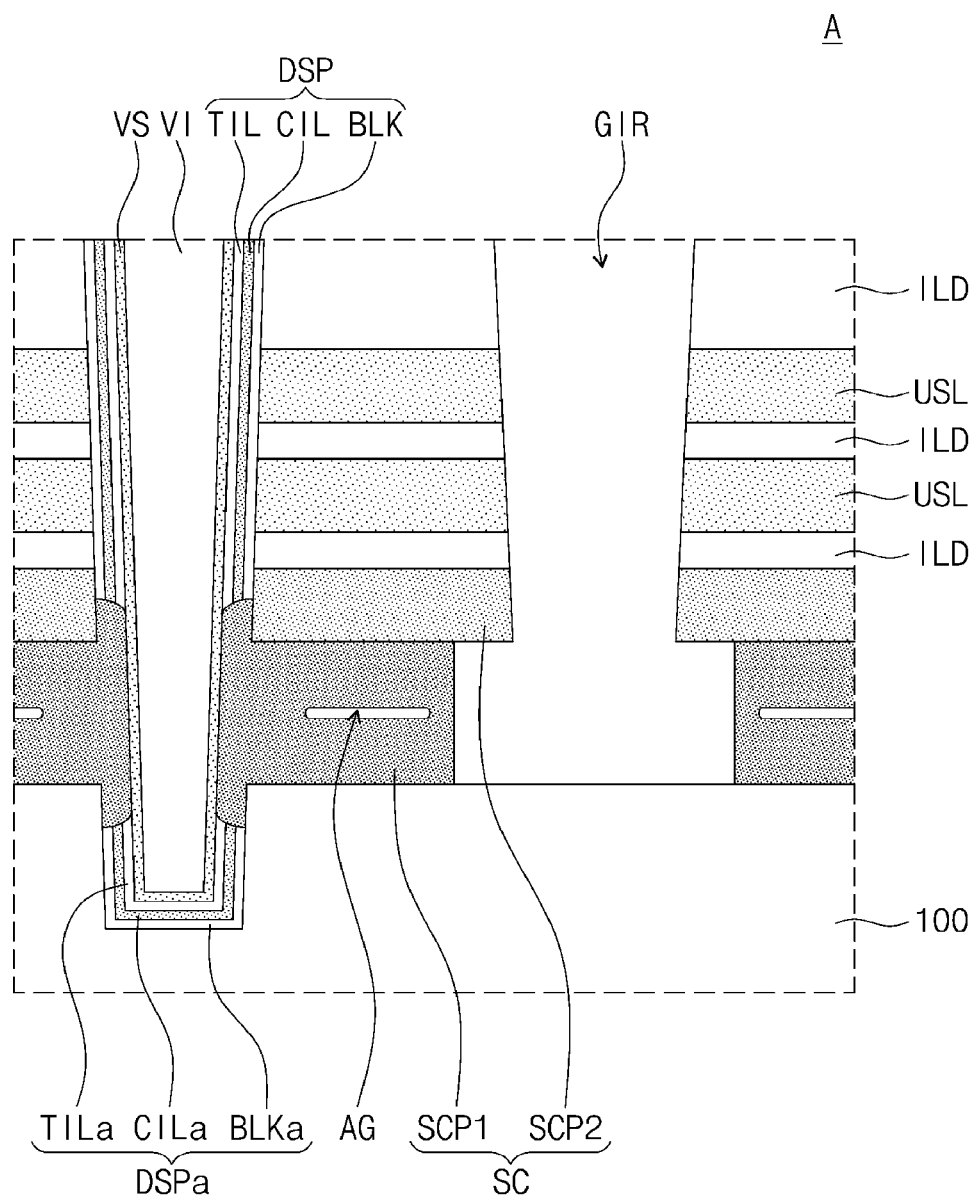

Referring to FIGS. 2, 19A and 19B, an isotropic etching process may be performed on the sidewall contact layer SCL to form the first source conductive pattern SCP1. The first source conductive pattern SCP1 may be formed in the undercut region UC and the horizontal recess region HR.

In addition, the sacrificial spacers 131 may also be etched in the isotropic etching process of the sidewall contact layer SCL to form the gate isolation regions GIR which expose sidewalls of the upper sacrificial layers USL and the insulating layers ILD of the mold structure 110. The isotropic etching process of the sidewall contact layer SCL and the sacrificial spacers 131 may use an etch recipe having an etch selectivity with respect to the mold structure 110. The isotropic etching process of the sidewall contact layer SCL and the sacrificial spacers 131 may be a wet etching process using a standard clean 1 (SC1) solution, ammonia ($NH_4OH$) water, potassium hydroxide (KOH), or ethylenediamine pyrocatechol (EDP).

Sidewalls of the mold structure 110 may be exposed by the isotropic etching process of the sidewall contact layer SCL and the sacrificial spacers 131. In some embodiments, since the discontinuous interface S or the air gap AG is horizontally spaced apart from the through-hole H, it S or AG may not be exposed during the isotropic etching process.

Figure 19C:
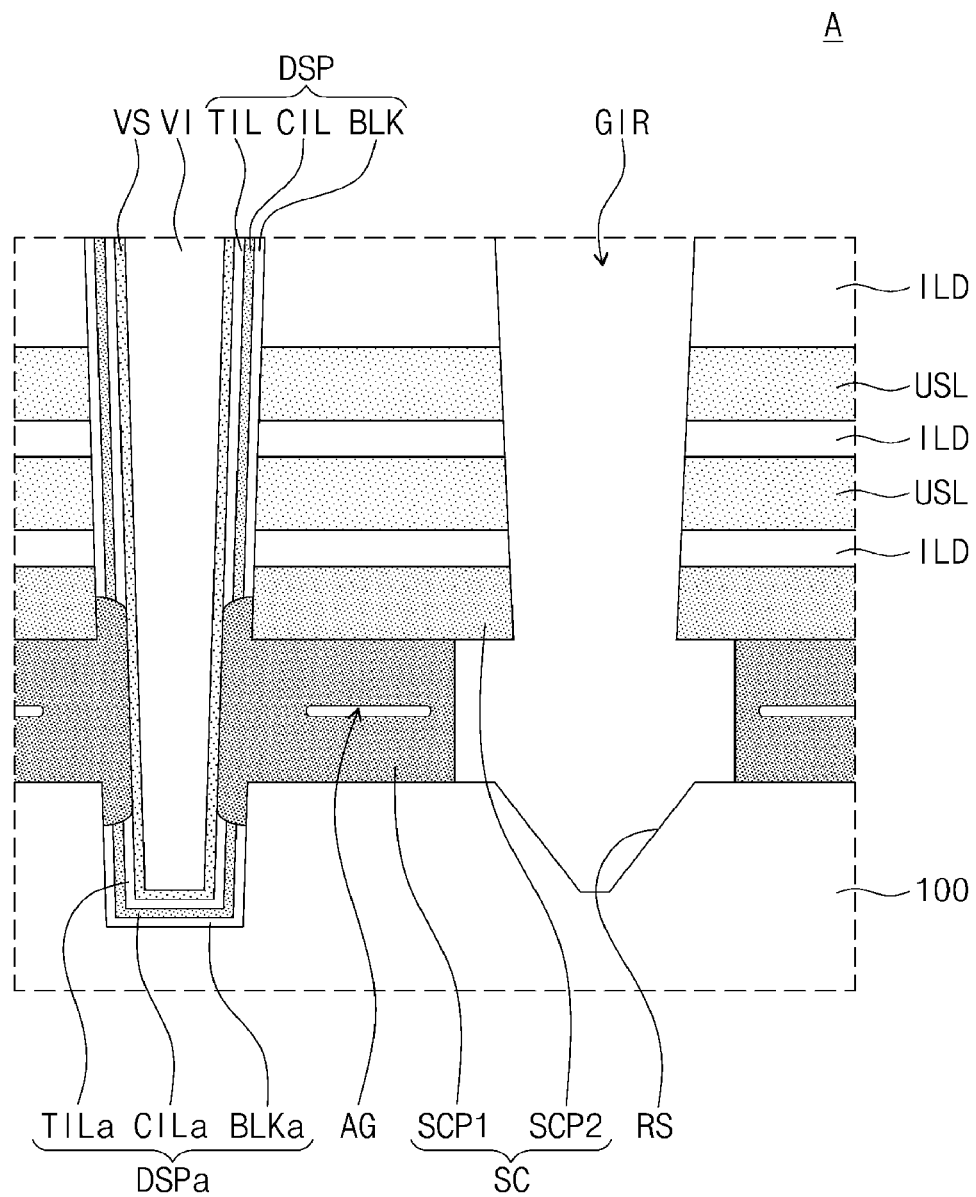

For example, the gate isolation regions GIR may define a sidewall of the first source conductive pattern SCP1 and may expose the horizontal semiconductor layer 100. In some embodiments, the sidewall of the first source conductive pattern SCP1 may be laterally recessed when the gate isolation regions GIR are formed. According to certain embodiments, in the isotropic etching process of the sidewall contact layer SCL and the sacrificial spacers 131, a portion of the horizontal semiconductor layer 100 exposed by the gate isolation region GIR may be etched to form a recess region RS, as illustrated in FIG. 19C. Here, the recess region RS may be defined by sidewalls inclined with respect to the top surface of the horizontal semiconductor layer 100.

Figure 20A:
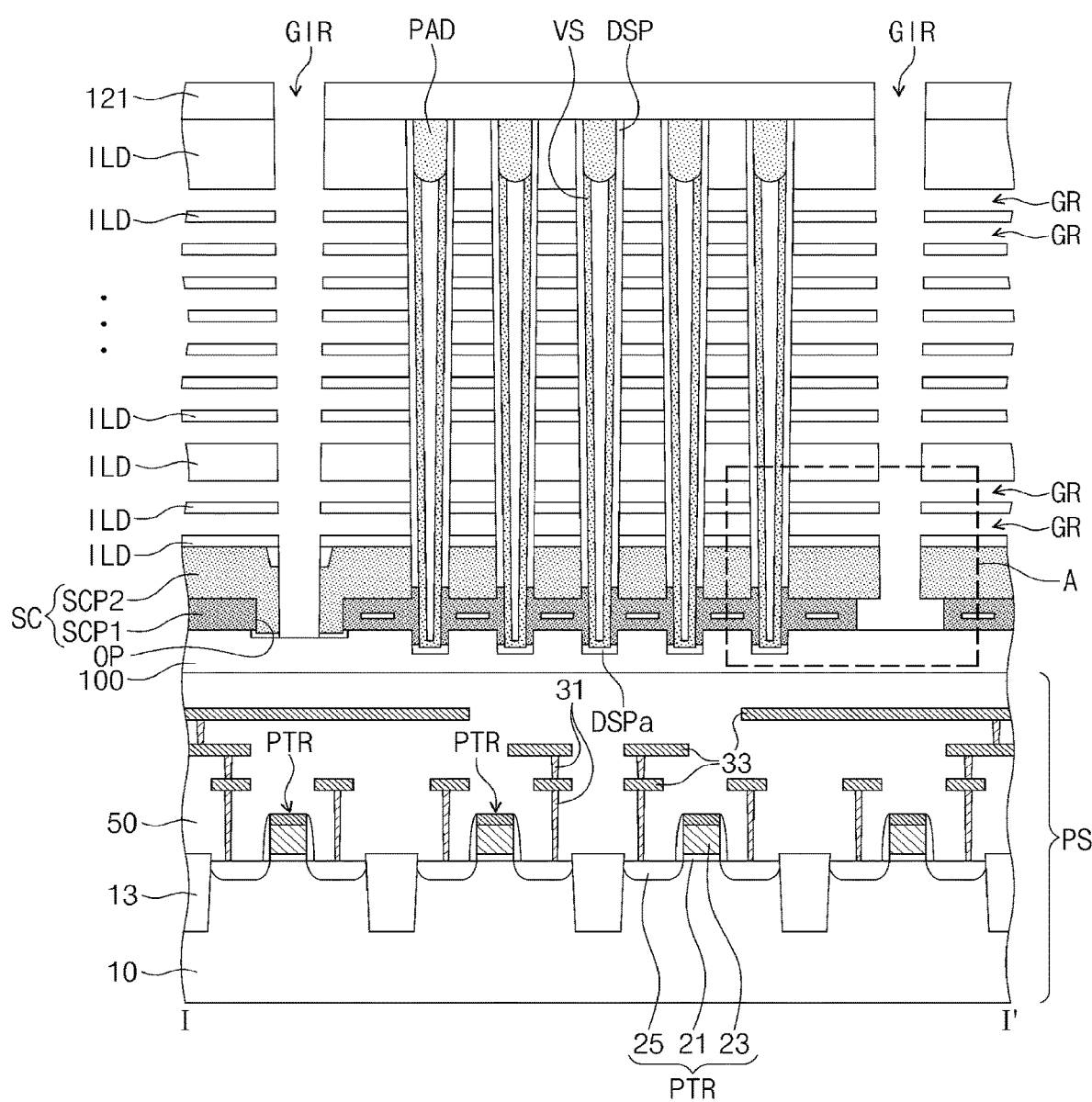
Figure 20B:
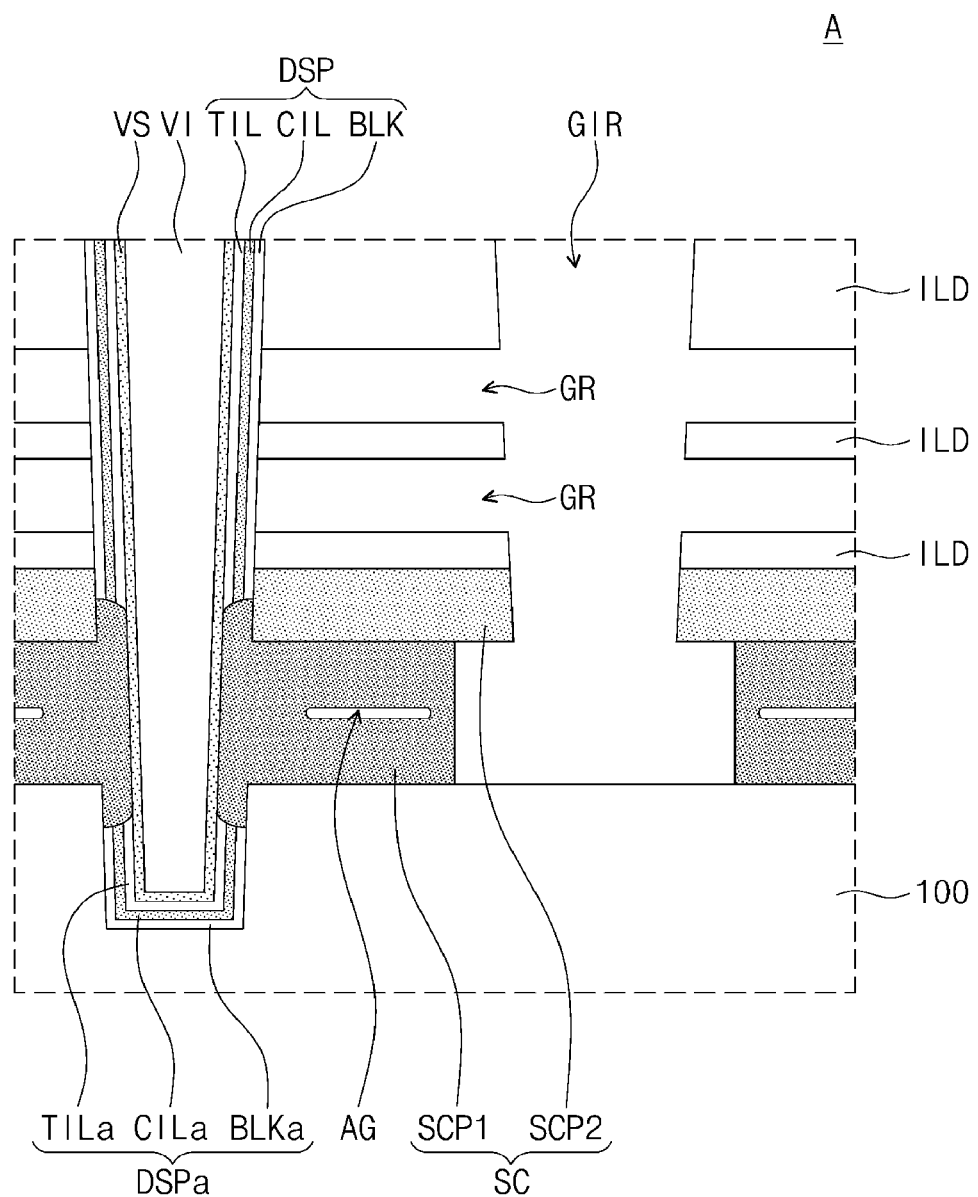
Figure 21A:
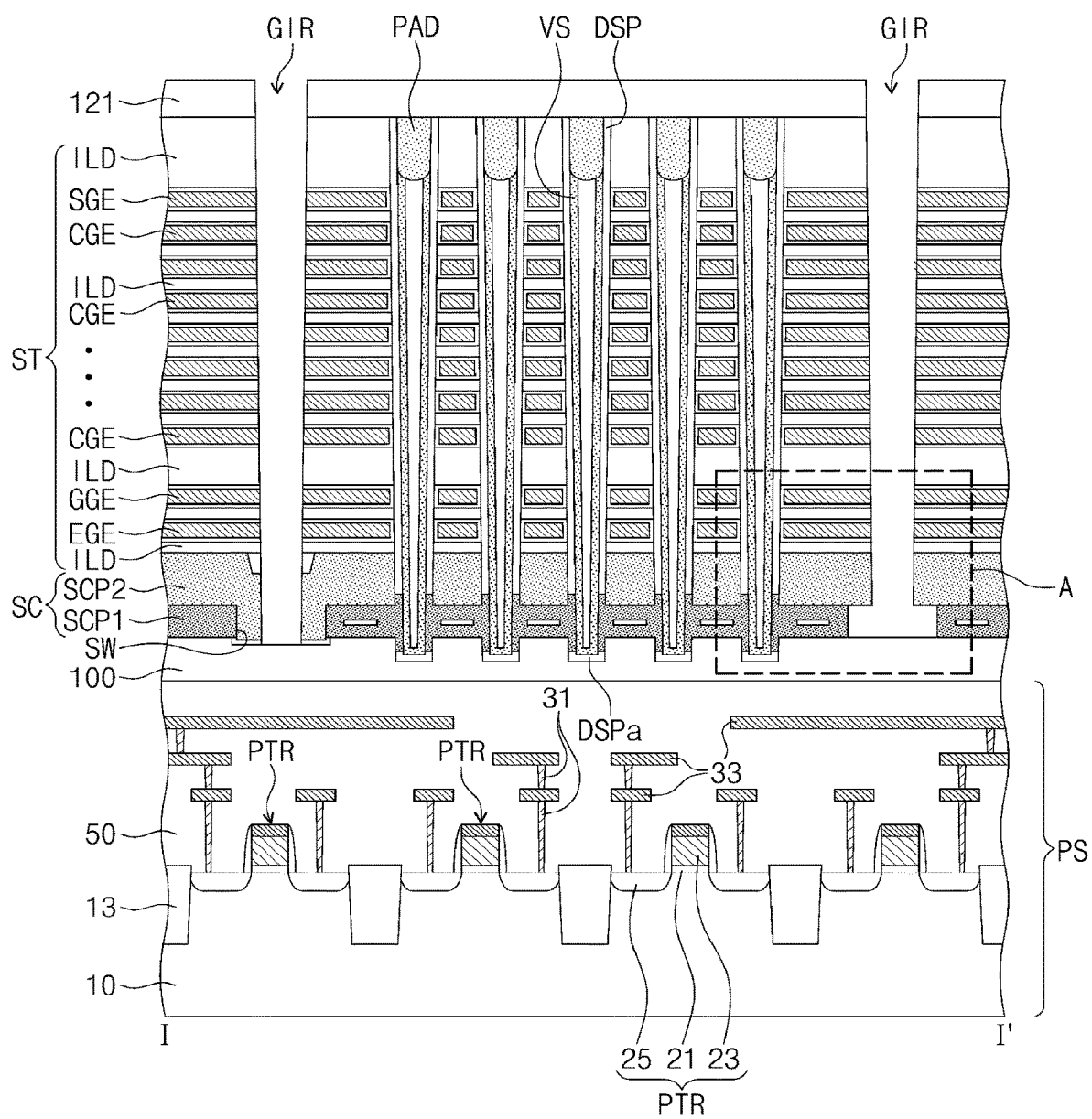
Figure 21B:
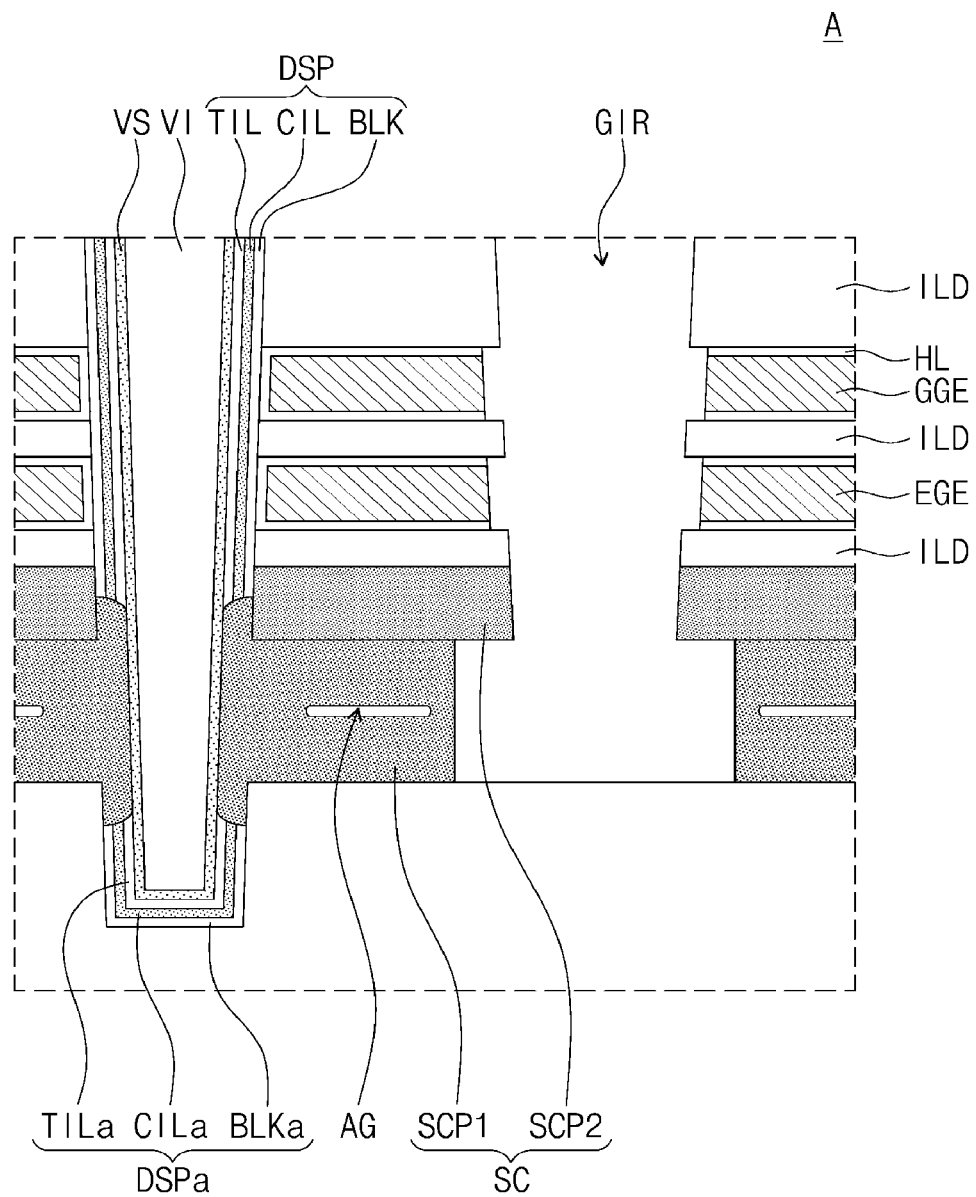
Figure 21C:
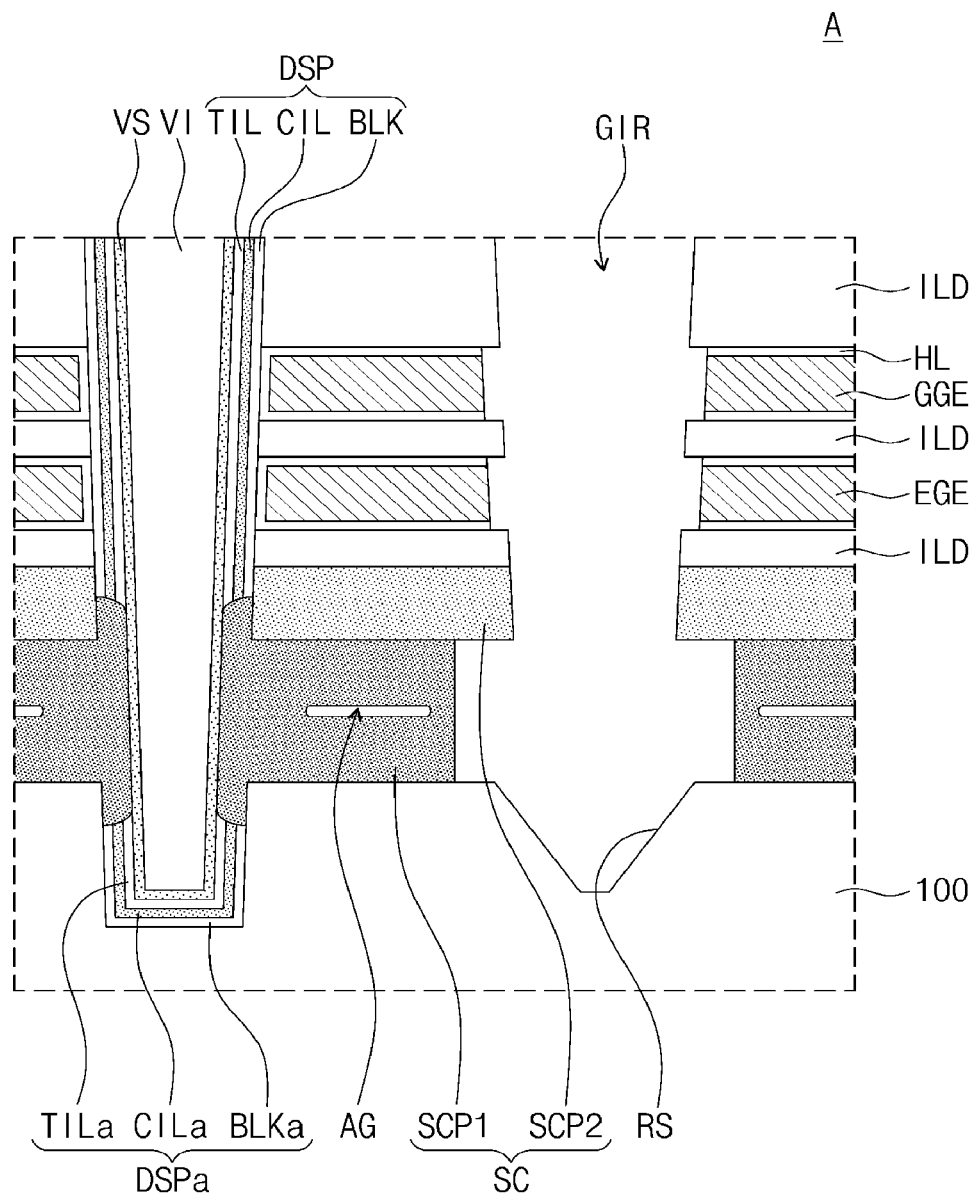

Referring to FIGS. 2, 20A and 20B, the upper sacrificial layers USL exposed by the gate isolation regions GIR may be removed to form gate regions GR between the insulating layers ILD. The upper sacrificial layers USL may be isotropically etched using an etch recipe having an etch selectivity with respect to the insulating layers ILD, the data storage patterns DSP and the first and second source conductive patterns SCP1 and SCP2, thereby forming the gate regions GR. The gate regions GR may laterally extend from the gate isolation region GIR and may expose portions of the sidewall of the data storage pattern DSP, respectively.

Referring to FIGS. 2, 21A, 21B and 21C, a horizontal insulating pattern HL may be formed to conformally cover inner surfaces of the gate regions GR. The horizontal insulating pattern HL may be formed to have a substantially uniform thickness on the inner surfaces of the gate regions GR.

Electrodes EGE, GGE, CGE and SGE may be formed to fill the gate regions GR having the horizontal insulating pattern HL, respectively. The electrodes EGE, GGE, CGE and SGE may partially fill the gate regions GR or may completely fill the gate regions GR. In some embodiments, the formation of the electrodes EGE, GGE, CGE and SGE may include sequentially depositing a metal nitride layer (e.g., TiN, TaN, or WN) and a metal layer (e.g., W, Al, Ti, Ta, Co, or Cu). Subsequently, the metal nitride layer and the metal layer disposed in the gate isolation regions GIR may be removed to locally form the electrodes EGE, GGE, CGE and SGE in the gate regions GR, respectively.

In the 3D semiconductor memory device according to some embodiments of the inventive concepts, the electrode structure may be disposed on the source structure parallel to the top surface of the horizontal semiconductor layer, and the source structure may contact a lower portion of the sidewall of the vertical semiconductor pattern used as channels of the memory cell transistors. Thus, processes for electrical connection between the vertical semiconductor pattern and the source structure may be omitted.

A portion of the first source conductive pattern of the source structure may protrude in the direction perpendicular to the top surface of the horizontal semiconductor layer to optimize a distance between the first source conductive pattern and the erase control gate electrode corresponding to the lowermost layer of the electrode structure. Thus, occurrence of the gate induced drain leakage (GIDL) current may be optimized in the erase operation of the memory cell array, and thus operating characteristics of the 3D semiconductor memory device may be improved.

The first source conductive pattern may include the discontinuous interface (e.g., the seam) or the air gap. Since the discontinuous interface (e.g., the seam) or the air gap is laterally spaced apart from the common source plug, it is possible to prevent a loss of the first source conductive pattern in processes for manufacturing the 3D semiconductor memory device.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
    a source structure on a horizontal semiconductor layer, the source structure comprising a first source conductive pattern and a second source conductive pattern which are sequentially stacked on the horizontal semiconductor layer;
    an electrode structure comprising a plurality of electrodes vertically stacked on the source structure;
    a vertical semiconductor pattern penetrating the electrode structure and the source structure;
    a contact plug penetrating the electrode structure and the source structure and spaced apart from the vertical semiconductor pattern; and
    an insulating spacer disposed between the contact plug and the electrode structure,
    wherein the contact plug comprises a lower portion adjacent to the source structure, and
    wherein the lower portion of the contact plug includes a void.

2. The 3D semiconductor memory device of claim 1, wherein the void of the lower portion of the contact plug is positioned at a level between a top surface of the first source conductive pattern and a bottom surface of the first source conductive pattern.

3. The 3D semiconductor memory device of claim 1, wherein the contact plug further comprises an upper portion adjacent to the electrode structure, and wherein a width of the lower portion is greater than a width of the upper portion.

4. The 3D semiconductor memory device of claim 1, wherein a portion of a sidewall of the vertical semiconductor pattern is in contact with the source structure.

5. The 3D semiconductor memory device of claim 1, wherein the first source conductive pattern includes a discontinuous interface at a level between a top surface of the horizontal semiconductor layer and a bottom surface of the second source conductive pattern.

6. The 3D semiconductor memory device of claim 5, wherein the discontinuous interface is laterally spaced apart from the vertical semiconductor pattern and the contact plug.

7. The 3D semiconductor memory device of claim 5, wherein the discontinuous interface is enclosed by the first source conductive pattern.

8. The 3D semiconductor memory device of claim 1, wherein the contact plug further comprises an upper portion adjacent to the electrode structure, and wherein the upper portion of the contact plug includes a discontinuous interface.

9. The 3D semiconductor memory device of claim 1, wherein a first portion of a sidewall of the vertical semiconductor pattern is horizontally spaced apart from the second source conductive pattern, and wherein a second portion of the sidewall of the vertical semiconductor pattern is in contact with the first source conductive pattern.

10. The 3D semiconductor memory device of claim 1, wherein the first and second source conductive patterns include a semiconductor material doped with charge carrier impurities having a first conductivity type, and wherein a concentration of the charge carrier impurities in the first source conductive pattern is greater than a concentration of the charge carrier impurities in the second source conductive pattern.

11. The 3D semiconductor memory device of claim 1, further comprising:
    a data storage pattern vertically extending between the vertical semiconductor pattern and the electrode structure,
    wherein a bottom surface of the data storage pattern is in contact with a portion of the first source conductive pattern.

12. The 3D semiconductor memory device of claim 11, wherein the bottom surface of the data storage pattern is located at a level between a bottom surface of a lowermost one of the electrodes and a bottom surface of the second source conductive pattern.

13. The 3D semiconductor memory device of claim 1, wherein the first source conductive pattern comprises:
    a lower portion adjacent to a top surface of the horizontal semiconductor layer; and
    an upper portion adjacent to a bottom surface of the second source conductive pattern, and
    wherein the upper portion of the first source conductive pattern and the lower portion of the first source conductive pattern have different crystal structures from each other.

14. The 3D semiconductor memory device of claim 13, wherein the first source conductive pattern further comprises:
a sidewall portion which extends from the upper and lower portions of the first source conductive pattern in a direction perpendicular to the top surface of the horizontal semiconductor layer and surrounds a second portion of a sidewall of the vertical semiconductor pattern.

15. The 3D semiconductor memory device of claim 14, wherein a top surface of the sidewall portion of the first source conductive pattern is located at a level between a bottom surface of a lowermost one of the electrodes and a top surface of the first source conductive pattern, and
wherein a bottom surface of the sidewall portion of the first source conductive pattern is located at a level between a bottom surface of the vertical semiconductor pattern and the top surface of the horizontal semiconductor layer.

16. The 3D semiconductor memory device of claim 13, wherein the upper portion of the first source conductive pattern includes amorphous or poly-crystalline silicon, and
wherein the lower portion of the first source conductive pattern includes single-crystalline silicon.

17. The 3D semiconductor memory device of claim 13, wherein the upper portion of the first source conductive pattern includes amorphous silicon, and
wherein the lower portion of the first source conductive pattern includes poly-crystalline silicon.

18. A three-dimensional (3D) semiconductor memory device comprising:
peripheral circuits integrated on a semiconductor substrate;
peripheral interconnection lines connected to the peripheral circuits;
a lower insulating layer covering the peripheral circuits and the peripheral interconnection lines;
a horizontal semiconductor layer on the lower insulating layer;
a source structure on the horizontal semiconductor layer, the source structure comprising a first source conductive pattern and a second source conductive pattern which are sequentially stacked on the horizontal semiconductor layer;
an electrode structure comprising a plurality of electrodes vertically stacked on the source structure;
a vertical semiconductor pattern penetrating the electrode structure and the source structure;
a data storage pattern vertically extending between the vertical semiconductor pattern and the electrode structure;
a contact plug penetrating the electrode structure and the source structure and spaced apart from the vertical semiconductor pattern; and
an insulating spacer disposed between the contact plug and the electrode structure,
wherein a portion of a sidewall of the vertical semiconductor pattern is in contact with the first source conductive pattern, and
wherein the contact plug comprises a lower portion adjacent to the source structure, and
wherein the lower portion of the contact plug includes a void.

19. The 3D semiconductor memory device of claim 18, wherein the void of the lower portion of the contact plug is positioned at a level between a top surface of the first source conductive pattern and a bottom surface of the first source conductive pattern.

20. The 3D semiconductor memory device of claim 18, wherein the first source conductive pattern includes a discontinuous interface at a level between a top surface of the horizontal semiconductor layer and a bottom surface of the second source conductive pattern.

* * * * *